US008274108B2

(12) United States Patent
Katsumata et al.

(10) Patent No.: US 8,274,108 B2
(45) Date of Patent: Sep. 25, 2012

(54) NONVOLATILE SEMICONDUCTOR MEMORY DEVICE AND METHOD FOR MANUFACTURING THE SAME

(75) Inventors: Ryota Katsumata, Kanagawa-ken (JP); Masaru Kito, Kanagawa-ken (JP); Masaru Kidoh, Tokyo (JP); Hiroyasu Tanaka, Tokyo (JP); Megumi Ishiduki, Kanagawa-ken (JP); Yosuke Komori, Kanagawa-ken (JP); Yoshiaki Fukuzumi, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 299 days.

(21) Appl. No.: 12/705,231

(22) Filed: Feb. 12, 2010

(65) Prior Publication Data

US 2010/0207190 A1    Aug. 19, 2010

(30) Foreign Application Priority Data

Feb. 16, 2009    (JP) .................................. 2009-032988

(51) Int. Cl.
*H01L 29/788*    (2006.01)
*H01L 21/336*    (2006.01)

(52) U.S. Cl. ........ 257/319; 257/314; 257/316; 257/321; 257/324; 257/326; 257/E21.422; 257/E21.423; 257/E21.679; 257/E21.68; 257/E29.3; 365/185.01; 365/185.11; 365/185.29; 438/257; 438/258; 438/264; 438/266; 438/268

(58) Field of Classification Search .................. 257/314, 257/316, 319, 321, 324, 326, E21.422, E21.423, 257/E21.679, E21.68, E29.3; 365/185.01, 365/185.11, 185.29; 438/257, 258, 264, 438/266, 268

See application file for complete search history.

(56) References Cited

U.S. PATENT DOCUMENTS 6,727,544 B2    4/2004    Endoh et al.
(Continued)

FOREIGN PATENT DOCUMENTS

JP    2007-266143    10/2007
(Continued)

OTHER PUBLICATIONS

U.S. Appl. No. 13/236,744, filed Sep. 20, 2011, Iino, et al.
(Continued)

*Primary Examiner* — Dao H Nguyen
(74) *Attorney, Agent, or Firm* — Oblon, Spivak, McClelland, Maier & Neustadt, L.L.P.

(57) ABSTRACT

A nonvolatile semiconductor memory device, includes: a stacked body including a plurality of insulating films alternately stacked with a plurality of electrode films, the electrode films being divided to form a plurality of control gate electrodes aligned in a first direction; a plurality of semiconductor pillars aligned in a stacking direction of the stacked body, the semiconductor pillars being arranged in a matrix configuration along the first direction and a second direction intersecting the first direction to pierce the control gate electrodes; and a connection member connecting a lower end portion of one of the semiconductor pillars to a lower end portion of one other of the semiconductor pillars, an upper end portion of the one of the semiconductor pillars being connected to a source line, an upper end portion of the one other of the semiconductor pillars being connected to a bit line. At least some of the control gate electrodes are pierced by two of the semiconductor pillars adjacent to each other in the second direction. Two of the semiconductor pillars being connected to each other by the connection member pierce mutually different control gate electrodes.

14 Claims, 21 Drawing Sheets

U.S. PATENT DOCUMENTS

| | | |
|---|---|---|
| 6,870,215 B2 | 3/2005 | Endoh et al. |
| 6,933,556 B2 | 8/2005 | Endoh et al. |
| 7,983,084 B2 * | 7/2011 | Tokiwa et al. ............ 365/185.11 |
| 8,154,068 B2 * | 4/2012 | Katsumata et al. ............ 257/314 |
| 8,169,016 B2 * | 5/2012 | Higashi ......................... 257/314 |
| 2007/0252201 A1 | 11/2007 | Kito et al. |
| 2008/0173928 A1 * | 7/2008 | Arai et al. ..................... 257/316 |
| 2010/0159657 A1 * | 6/2010 | Arai et al. ..................... 438/268 |

FOREIGN PATENT DOCUMENTS

| | | |
|---|---|---|
| JP | 2009-146954 | 7/2009 |
| WO | WO 2009/075370 A1 | 6/2009 |

OTHER PUBLICATIONS

U.S. Appl. No. 12/679,991, filed Mar. 25, 2010, Fukuzumi et al.

\* cited by examiner

| | WRITING OPERATION | | READING OPERATION | | ERASING OPERATION |
|---|---|---|---|---|---|
| | SELECTED | UNSELECTED | SELECTED | UNSELECTED | SELECTED BLOCK |
| BIT LINE BL | VALUE "0": Vss<br>VALUE "1": Vdd | VALUE "0": Vss<br>VALUE "1": Vdd | $V_{bl}$ | $V_{bl}$ | $V_{erase}$ |
| SELECTION GATE ELECTRODE SGb | $V_{sg}$ | $V_{off}$ | $V_{on}$ | $V_{off}$ | $V_{sg}$ |
| CONTROL GATE ELECTRODE CGb (FOURTH LAYER) | $V_{pass}$ | $V_{pass}$ | $V_{read}$ | $V_{read}$ | $V_{ss}$ |
| CONTROL GATE ELECTRODE CGb (THIRD LAYER) | $V_{pgm}$ | $V_{pgm}$ | $V_{ss}$ | $V_{ss}$ | $V_{ss}$ |
| CONTROL GATE ELECTRODE CGb (SECOND LAYER) | $V_{pass}$ | $V_{pass}$ | $V_{read}$ | $V_{read}$ | $V_{ss}$ |
| CONTROL GATE ELECTRODE CGb (FIRST LAYER) | $V_{pass}$ | $V_{pass}$ | $V_{read}$ | $V_{read}$ | $V_{ss}$ |
| BACK GATE BG | $V_{on}$ | $V_{on}$ | $V_{on}$ | $V_{on}$ | $V_{on}$ |
| CONTROL GATE ELECTRODE CGs (FIRST LAYER) | $V_{pass}$ | $V_{pass}$ | $V_{read}$ | $V_{read}$ | $V_{ss}$ |
| CONTROL GATE ELECTRODE CGs (SECOND LAYER) | $V_{pass}$ | $V_{pass}$ | $V_{read}$ | $V_{read}$ | $V_{ss}$ |
| CONTROL GATE ELECTRODE CGs (THIRD LAYER) | $V_{pass}$ | $V_{pass}$ | $V_{read}$ | $V_{read}$ | $V_{ss}$ |
| CONTROL GATE ELECTRODE CGs (FOURTH LAYER) | $V_{pass}$ | $V_{pass}$ | $V_{read}$ | $V_{read}$ | $V_{ss}$ |
| SELECTION GATE ELECTRODE SGs | $V_{off}$ | $V_{off}$ | $V_{on}$ | $V_{off}$ | $V_{sg}$ |
| SOURCE LINE SL | Vdd | Vdd | Vss | Vss | $V_{erase}$ |

FIG. 6

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2009-032988, filed on Feb. 16, 2009; the entire contents of which are incorporated herein by reference.

BACKGROUND OF THE INVENTION

1. Field of the Invention

The invention relates to a nonvolatile semiconductor memory device including multiple insulating films alternately stacked with multiple electrode films and a method for manufacturing the same.

2. Background Art

Semiconductor memory devices of flash memory and the like conventionally are constructed by two-dimensionally integrating memory cells on the surface of a silicon substrate. In such a semiconductor memory device, it is necessary to increase the integration of memory cells to reduce the cost per bit and increase the storage capacity. However, such high integration in recent years has become difficult in regard to both cost and technology.

Methods of three-dimensional integration by stacking memory cells have been proposed as technology to breakthrough the limitations of increasing the integration. However, methods that simply stack and pattern one layer after another undesirably increase the number of steps as the number of stacks increases, and the costs undesirably increase. In particular, the increase of lithography steps for patterning the transistor structure is a main cause of increasing costs. Therefore, the reduction of the chip surface area per bit by stacking has not led to lower costs per bit as much as downsizing within the chip plane and is problematic as a method for increasing the storage capacity.

In consideration of such problems, the inventors have proposed a collectively patterned three-dimensional stacked memory (for example, refer to JP-A 2007-266143 (Kokai)). In such technology, selection transistors including silicon pillars aligned in the vertical direction as channels are formed on a silicon substrate and a stacked body is formed thereupon by alternately stacking electrode films and insulative films and subsequently making through-holes in the stacked body by collective patterning. A charge storage layer is formed on a side face of each through-hole, and silicon pillars are newly buried in the interiors of through-holes to connect to the silicon pillars of the selection transistors. A memory transistor is thereby formed at an intersection between each electrode film and the silicon pillar. Then, selection transistors are further formed thereupon.

In such a collectively patterned three-dimensional stacked memory, a charge can be removed from and put into the charge storage layer from the silicon pillar to store information by controlling an electrical potential of each electrode film and each silicon pillar. According to such technology, the through-holes are made by collectively patterning the stacked body. Therefore, the number of lithography steps does not increase and cost increases can be suppressed even in the case where the number of stacks of the electrode films increases.

However, to construct such a collectively patterned three dimensional stacked memory, it is necessary to remove silicon oxide of native oxide films and the like from the bottom faces of the through-holes when burying silicon pillars in the interiors of the through-holes made in the stacked body to provide good electrical contact between the silicon pillars forming the channels of the selection transistors and the newly buried silicon pillars. Normally, pre-processing is performed using a hydrofluoric acid-based solution prior to burying the silicon pillars in the through-holes. However, such pre-processing damages the charge storage layer and undesirably causes deterioration of the memory transistor characteristics.

SUMMARY OF THE INVENTION

According to an aspect of the invention, there is provided a nonvolatile semiconductor memory device, including: a stacked body including a plurality of insulating films alternately stacked with a plurality of electrode films, the electrode films being divided to form a plurality of control gate electrodes aligned in a first direction; a plurality of selection gate electrodes provided on the stacked body and aligned in the first direction; a plurality of semiconductor pillars aligned in a stacking direction of the stacked body, the semiconductor pillars being arranged in a matrix configuration along the first direction and a second direction intersecting the first direction to pierce the control gate electrodes and the selection gate electrodes; a plurality of source lines aligned in the first direction and connected to upper end portions of some of the semiconductor pillars; a plurality of bit lines aligned in the second direction and connected to upper end portions of a remainder of the semiconductor pillars; a connection member connecting a lower end portion of one of the semiconductor pillars to a lower end portion of one other of the semiconductor pillars, an upper end portion of the one of the semiconductor pillars being connected to the source line, an upper end portion of the one other of the semiconductor pillars being connected to the bit line; a charge storage layer provided between one of the control gate electrode and one of the semiconductor pillar; and a gate insulating film provided between one of the selection gate electrode and one of the semiconductor pillar, at least some of the control gate electrodes being pierced by two of the semiconductor pillars adjacent to each other in the second direction, two of the semiconductor pillars being connected to each other by the connection member and provided to pierce mutually different control gate electrodes.

According to another aspect of the invention, there is provided a method for manufacturing a nonvolatile semiconductor memory device, including: forming a conducting film on a substrate; making a plurality of recesses in an upper face of the conducting film, the recesses being arranged in a matrix configuration along a first direction and a second direction intersecting the first direction; filling sacrificial members into the recesses; forming a stacked body on the conducting film, the stacked body including a plurality of insulating films alternately stacked with a plurality of electrode films; making through-holes in the stacked body, the through-holes being aligned in a stacking direction of the stacked body and provided in a matrix configuration along the first direction and the second direction, two of the through-holes adjacent in the second direction reaching each of the sacrificial members; performing etching via the through-holes to remove the sacrificial members; forming a charge storage layer on inner faces of the through-holes and the recesses; filling a semiconductor material into interiors of the through-holes and the recesses to form a connection member in the recesses and semiconductor pillars in the through-holes; making a trench in the stacked body to divide the electrode films into a plurality of control gate electrodes aligned in the first direction, the trench being aligned in the first direction to link regions between the two semiconductor pillars connected to each other by the connection member, the control gate electrodes being pierced by two of the semiconductor pillars arranged along the second direction; forming another conducting film on the stacked body; making other through-holes in the another conducting film in regions directly above the through-holes; forming a gate insulating film on inner faces of the other through-holes; filling a semiconductor material into interiors of the other through-holes to form other semiconductor pillars connected to the semiconductor pillars; dividing the another conducting film to form a plurality of selection gate electrodes aligned in the first direction; forming a plurality of source lines aligned in the first direction and connected to upper end portions of some of the other semiconductor pillars; and forming a plurality of bit lines aligned in the second direction and connected to upper end portions of a remainder of the other semiconductor pillars.

BRIEF DESCRIPTION OF THE DRAWINGS

FIG. 6 illustrates potentials applied to each of the electrodes and interconnects during the operations of the nonvolatile semiconductor memory device according to the first embodiment;

DETAILED DESCRIPTION OF THE INVENTION

Embodiments of the invention will now be described with reference to the drawings.

First, a first embodiment of the invention will be described.

Figure 1:
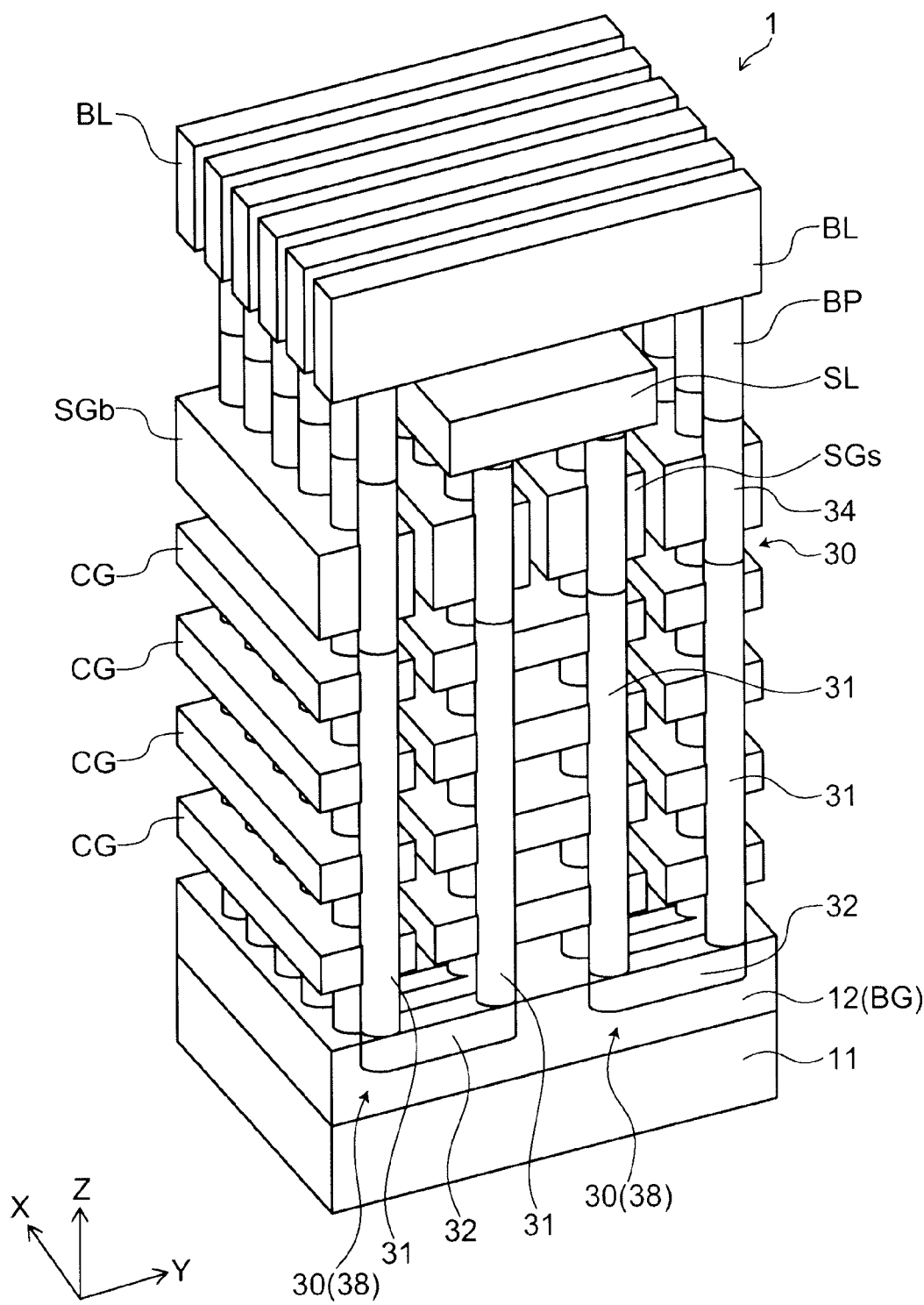
FIG. 1 is a perspective view illustrating a nonvolatile semiconductor memory device according to a first embodiment of the invention.

FIG. 1 is a perspective view illustrating a nonvolatile semiconductor memory device according to this embodiment.

Figure 2:
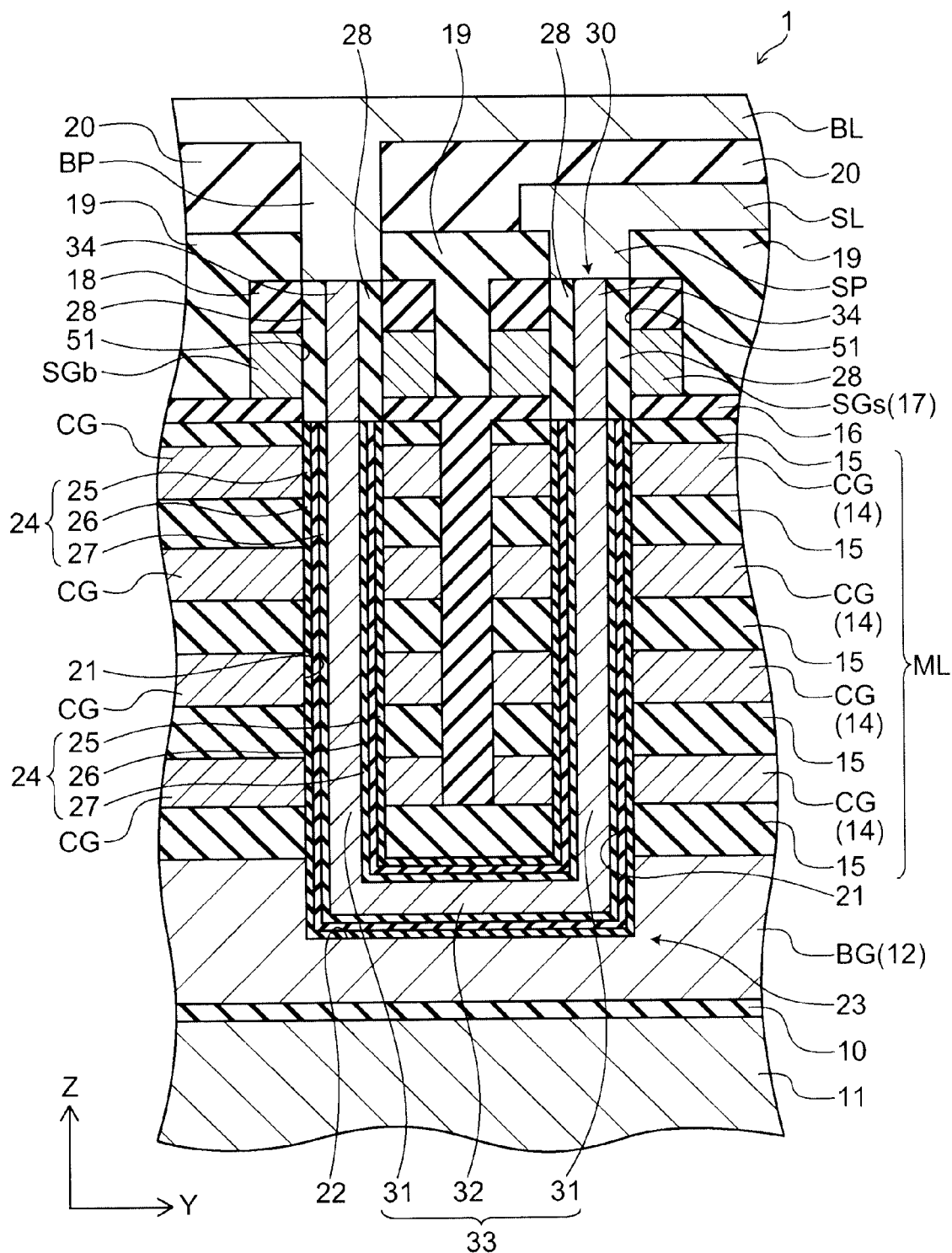
FIG. 2 is a cross-sectional view illustrating the nonvolatile semiconductor memory device according to the first embodiment.

FIG. 2 is a cross-sectional view illustrating the nonvolatile semiconductor memory device according to this embodiment.

Figure 3:
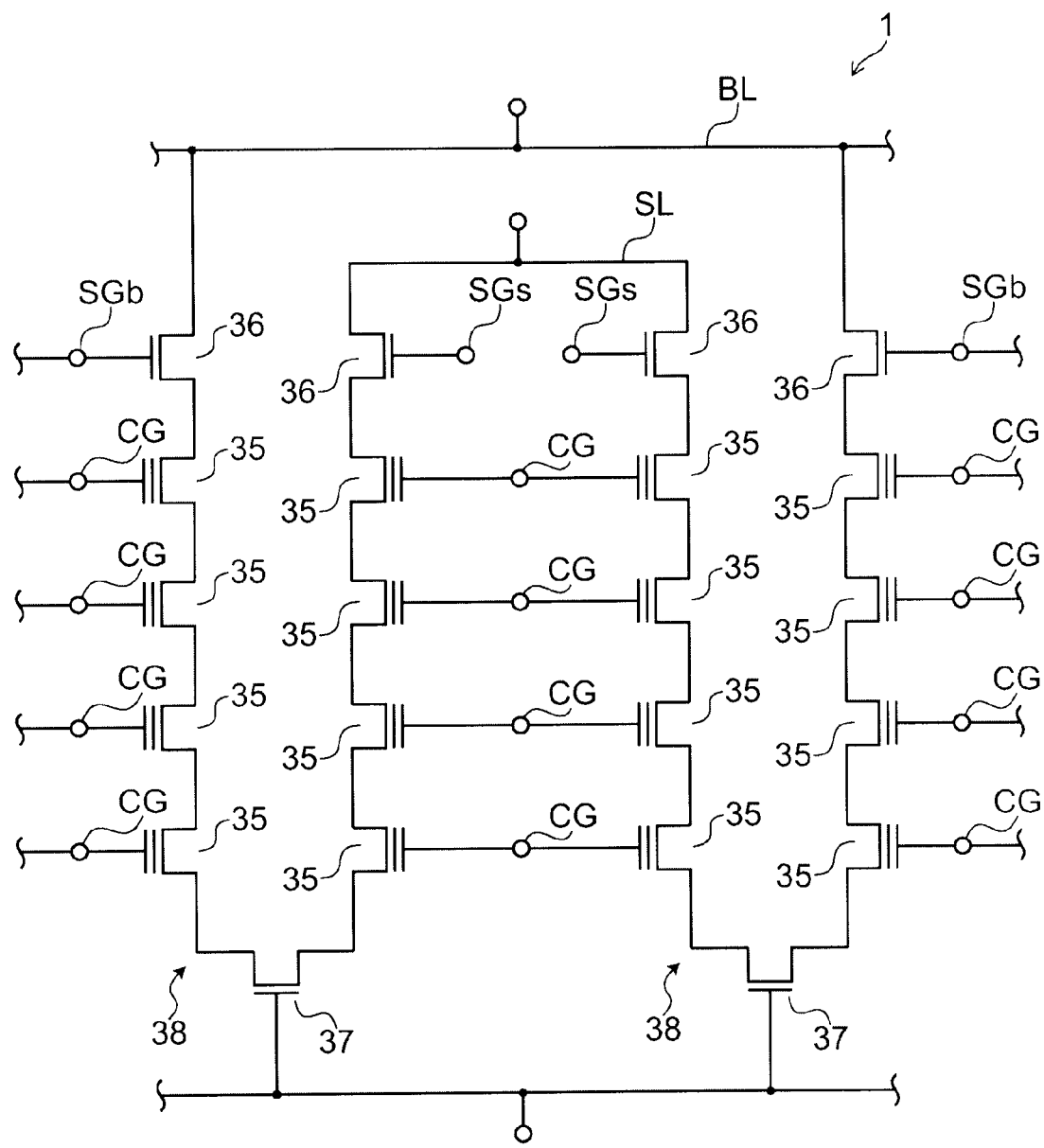
FIG. 3 is a circuit diagram illustrating the nonvolatile semiconductor memory device according to the first embodiment.

FIG. 3 is a circuit diagram illustrating the nonvolatile semiconductor memory device according to this embodiment.

Figure 4:
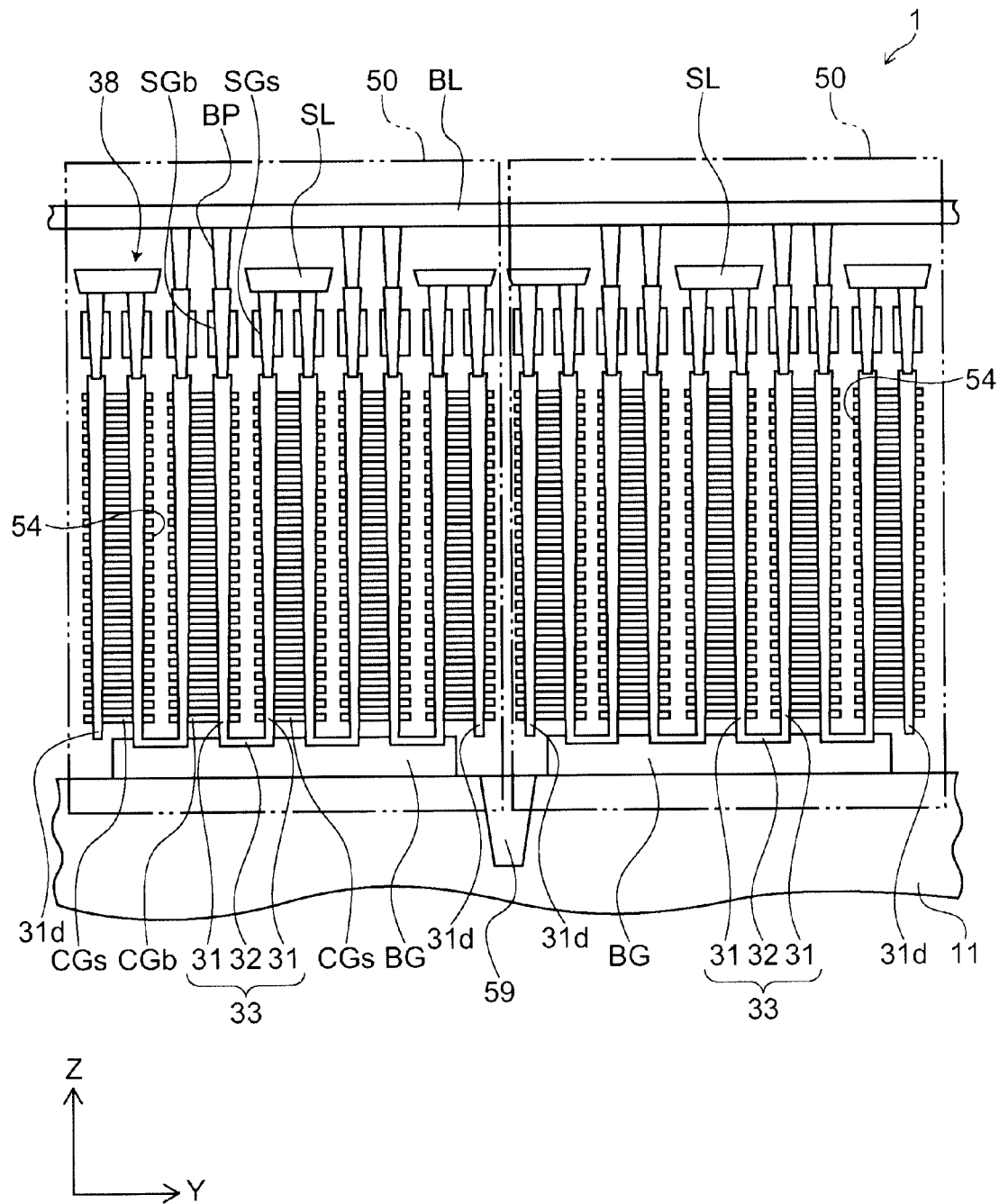
FIG. 4 is another cross-sectional view illustrating the nonvolatile semiconductor memory device according to the first embodiment.

FIG. 4 is another cross-sectional view illustrating the nonvolatile semiconductor memory device according to this embodiment.

Figure 5:
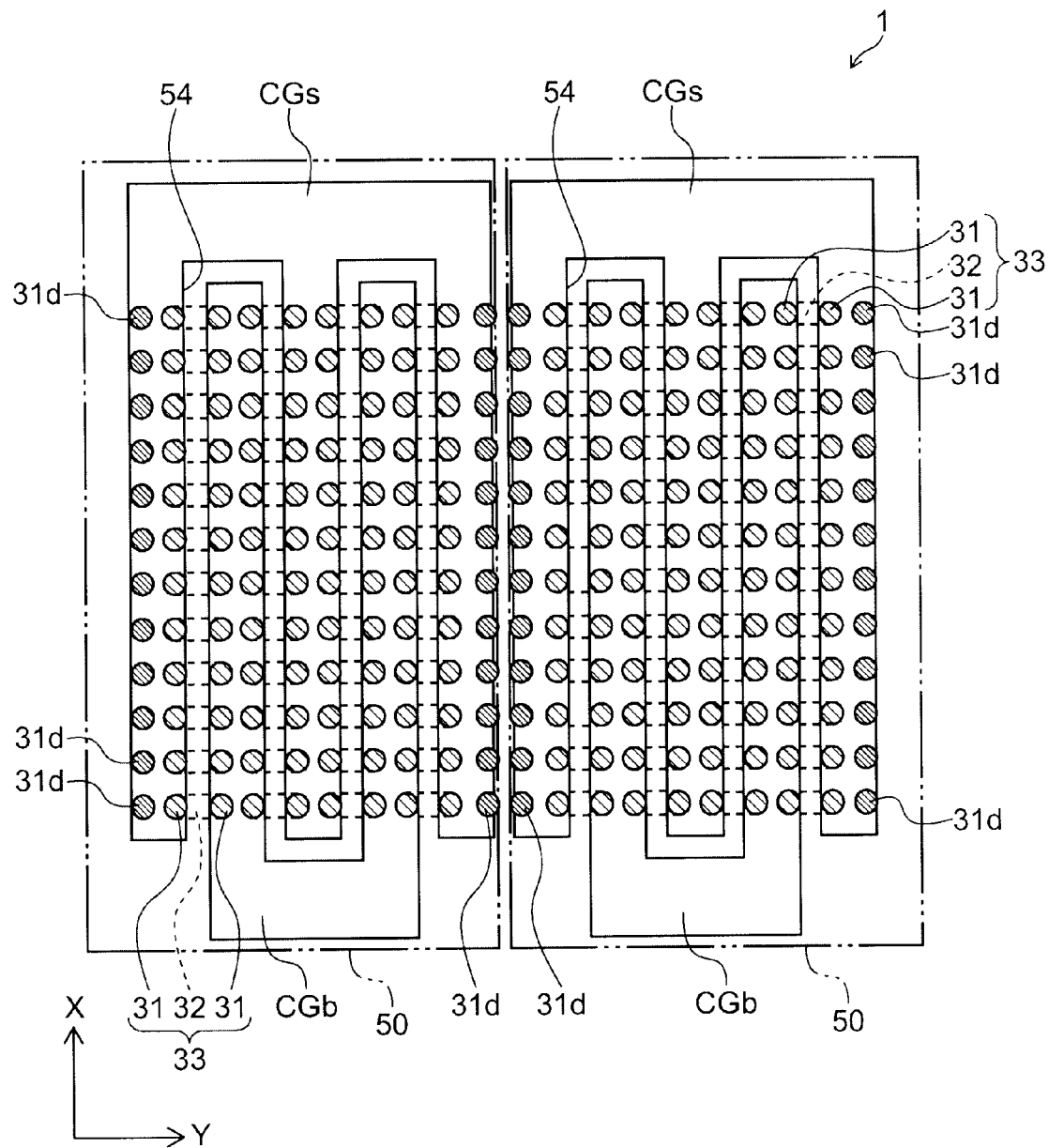
FIG. 5 is a plan view illustrating the nonvolatile semiconductor memory device according to the first embodiment.

FIG. 5 is a plan view illustrating the nonvolatile semiconductor memory device according to this embodiment.

Although FIG. 4 illustrates an example in which twenty-four layers of control gate electrodes are provided, FIG. 1 to FIG. 3 illustrate only four layers of control gate electrodes for easier viewing of the drawings. For easier viewing of the drawings in FIG. 1, FIG. 4, and FIG. 5, only a silicon substrate and electrically conducting portions are illustrated, and insulating portions are omitted. In particular, FIG. 5 illustrates only the silicon substrate, back gates, the control gate electrodes, and U-shaped silicon members. FIG. 3 illustrates one pair of memory strings sharing the control gate electrodes.

Features of the nonvolatile semiconductor memory device according to this embodiment include providing a collectively patterned three dimensional stacked memory device in which memory transistors are provided at intersections between silicon pillars and control gate electrodes by forming one pair of silicon pillars in a U-shaped pillar configuration, piercing each of the control gate electrodes with two series of silicon pillars, providing the pair of silicon pillars having the U-shaped pillar configuration to pierce mutually different control gate electrodes, dividing the memory cell formation region into multiple blocks, and therefore providing appropriate termination at block end portions and between blocks. Details of the configuration of such a nonvolatile semiconductor memory device will now be described.

A nonvolatile semiconductor memory device 1 (hereinbelow also simply referred to as "device 1") according to this embodiment illustrated in FIG. 1 and FIG. 2 includes a silicon substrate 11. A memory cell formation region in which memory cells are formed and a peripheral circuit region (not illustrated) in which peripheral circuits are formed are set in the silicon substrate 11. The peripheral circuit region is disposed around the memory cell formation region.

An insulating film 10 is provided on the silicon substrate 11 in the memory cell formation region. A conducting film, e.g., a polysilicon film 12, is formed thereupon to form a back gate BG. Multiple electrode films 14 are alternately stacked with multiple insulating films 15 on the back gate BG. The multiple electrode films 14 and the multiple insulating films 15 form a stacked body ML.

An XYZ orthogonal coordinate system will now be introduced for convenience of description in the specification. In this coordinate system, two mutually orthogonal directions parallel to an upper face of the silicon substrate 11 are taken as an X direction and a Y direction. A direction orthogonal to both the X direction and the Y direction, that is, the stacking direction of the layers, is taken as a Z direction.

The electrode films 14 are formed of, for example, polysilicon. In the central portion of the stacked body ML in the X direction, the electrode films 14 are divided along the Y direction to form multiple control gate electrodes CG aligned in the X direction. Each layer of the electrode films 14 is patterned to have the same pattern as viewed from above, i.e., the Z direction. As described below, the electrode films 14 are not divided along the Y direction at both X-direction end portions of the stacked body ML to form a pair of comb-shaped configurations. On the other hand, the insulating films 15 are made of, for example, silicon oxide ($SiO_2$) and function as inter-layer insulating films to insulate the electrode films 14 from each other.

An insulating film 16, a conducting film 17, and an insulating film 18 are formed in this order on the stacked body ML. The conducting film 17 is made of, for example, polysilicon and is divided along the Y direction to form multiple selection gate electrodes SG aligned in the X direction. Two of the selection gate electrodes SG are provided in the region directly above each of the control gate electrodes CG of the uppermost layer. In other words, the selection gate electrodes SG are aligned in the same direction (the X direction) as the control gate electrodes CG but with half the arrangement period. As described below, the selection gate electrodes SG include selection gate electrodes SGb on the bit line side and selection gate electrodes SGs on the source line side.

An insulating film 19 is provided on the insulating film 18. Source lines SL are provided on the insulating film 19 to align in the X direction. The source lines SL are disposed in the region directly above every other one of the control gate electrodes CG of the uppermost layer arranged along the Y direction. An insulating film 20 is provided on the insulating film 19 to cover the source lines SL. Multiple bit lines BL are provided on the insulating film 20 to align in the Y direction. The source lines SL and the bit lines BL may be formed from metal films.

Multiple through-holes 21 are made to pierce the stacked body ML and align in the stacking direction (the Z direction) of the layers. Each of the through-holes 21 pierces each level of the control gate electrodes CG such that the lower end reaches the back gate BG. The through-holes 21 are arranged in a matrix configuration along the X direction and the Y direction. Because the control gate electrodes CG are aligned in the X direction, the through-holes 21 arranged in the X direction pierce the same control gate electrodes CG. The arrangement period of the through-holes 21 in the Y direction is half of the arrangement period of the control gate electrodes CG. Thereby, two of the through-holes 21 arranged in the Y direction form one set, and the through-holes 21 of the same set pierce the same control gate electrodes CG.

A communicating hole 22 is made in the upper layer portion of the back gate BG to communicate from the lower end portion of one through-hole 21 to the lower end portion of another through-hole 21 positioned one series away from the one through-hole 21 in the Y direction as viewed from the one through-hole 21. Thereby, one continuous U-shaped hole 23 is made by one pair of through-holes 21 adjacent in the Y direction and the communicating hole 22 that communicates between the pair. Multiple U-shaped holes 23 are made in the stacked body ML.

An ONO film (Oxide Nitride Oxide film) 24 is provided on the inner face of the U-shaped hole 23. The ONO film 24 includes an insulative block layer 25, a charge storage layer 26, and an insulative tunneling layer 27 stacked in this order from the outside. The block layer 25 contacts the back gate BG, the control gate electrodes CG, and the insulating films 15. The block layer 25 and the tunneling layer 27 are made of, for example, silicon oxide. The charge storage layer 26 is made of, for example, silicon nitride.

A semiconductor material, e.g., polysilicon, doped with an impurity is filled into the interior of the U-shaped hole 23. Thereby, a U-shaped silicon member 33 is provided in the interior of the U-shaped hole 23. The portions of the U-shaped silicon member 33 positioned in the through-holes 21 form silicon pillars 31, and the portion of the U-shaped silicon member 33 positioned in the communicating hole 22 forms a connection member 32. The silicon pillars 31 have columnar configurations aligned in the Z direction and are, for example, circular columns. The connection member 32 has a columnar configuration aligned in the Y direction and is, for example, a rectangular column. The two silicon pillars 31 and the one connection member 32 forming the U-shaped silicon member 33 are formed integrally. Accordingly, the U-shaped silicon member 33 is formed continuously without breaks along the longitudinal direction thereof. The U-shaped silicon member 33 is insulated from the back gate BG and the control gate electrodes CG by the ONO film 24.

Multiple through-holes 51 are made in the insulating film 16, the selection gate electrodes SG, and the insulating film 18. Each of the through-holes 51 is made in a region directly above the through-hole 21 to communicate with the through-hole 21. Here, because the selection gate electrodes SG are aligned in the X direction, the through-holes 51 arranged in the X direction pierce the same selection gate electrode SG. The arrangement period of the through-holes 51 in the Y direction is the same as the arrangement period of the selection gate electrodes SG, and the phase of the arrangement also is the same. Accordingly, the multiple through-holes 51 arranged in the Y direction correspond to the selection gate electrodes SG on a one-to-one basis and pierce mutually different selection gate electrodes SG.

A gate insulating film 28 is formed on the inner face of the through-hole 51. Polysilicon, for example, is filled into the interior of the through-hole 51 to form a silicon pillar 34. The silicon pillar 34 has a columnar configuration aligned in the Z direction and is, for example, a circular column. The lower end portion of the silicon pillar 34 connects to the upper end portion of the silicon pillar 31 formed in the region directly below. The silicon pillar 34 is insulated from the selection gate electrode SG by the gate insulating film 28. The U-shaped silicon member 33 and one pair of silicon pillars 34 connected to the upper end portions thereof form a U-shaped pillar 30.

The positional relationship of the U-shaped pillar 30 with the control gate electrodes CG, the selection gate electrodes SG, the source lines SL, and the bit lines BL will now be described.

The U-shaped pillar 30 is formed of one pair of silicon pillars 34 and 31 adjacent in the Y direction and connected to each other by the connection member 32. On the other hand, the control gate electrodes CG, the selection gate electrodes SG, and the source lines SL are aligned in the X direction; and the bit lines BL are aligned in the Y direction. Although the arrangement period in the Y direction of the U-shaped pillars 30 and the control gate electrodes CG are the same, the phases are shifted half a period. Therefore, the pair of silicon pillars 31 of each of the U-shaped pillars 30, i.e., the two silicon pillars 31 connected to each other by the connection member 32, pierce mutually different control gate electrodes CG. On the other hand, the two silicon pillars 31 adjacent in the Y direction and belonging to two U-shaped pillars 30 adjacent in the Y direction pierce common control gate electrodes CG.

The multiple silicon pillars 34 arranged in the Y direction pierce mutually different selection gate electrodes SG. Accordingly, the pair of silicon pillars 34 of each of the U-shaped pillars 30 also pierces mutually different selection gate electrodes SG. On the other hand, the multiple U-shaped pillars 30 arranged in the X direction pierce a common pair of selection gate electrodes SG.

Of the pair of silicon pillars 34 of each of the U-shaped pillars 30, one silicon pillar 34 is connected to the source line SL via a source plug SP buried in the insulating film 19. The other silicon pillar 34 is connected to the bit line BL via a bit plug BP buried in the insulating films 19 and 20. Accordingly, the U-shaped pillar 30 is connected between the bit line BL and the source line SL. In FIG. 1 to FIG. 4, the selection gate electrode SG disposed on the bit line side and pierced by the U-shaped pillar 30 is labeled as the selection gate electrode SGb. The selection gate electrode SG disposed on the source line side and pierced by the U-shaped pillar 30 is labeled as the selection gate electrode SGs. The U-shaped pillars 30 arranged in the X direction connect to a common source line and mutually different bit lines BL. Here the arrangement period of the U-shaped pillars 30 in the X direction is the same as the arrangement period of the bit lines BL. Therefore, in the X direction, the U-shaped pillars 30 correspond to the bit lines BL on a one-to-one basis. On the other hand, two of the U-shaped pillars 30 arranged in the Y direction connect as a set to each of the source lines SL and a common bit line BL.

In the device 1 illustrated in FIG. 1 to FIG. 3, the silicon pillars 31 function as channels and the control gate electrodes CG function as gate electrodes to form vertical memory transistors 35 at the intersections between the silicon pillars 31 and the control gate electrodes CG. Each of the memory transistors 35 functions as a memory cell by storing electrons in the charge storage layer 26 disposed between the silicon pillar 31 and the control gate electrode CG. Because multiple silicon pillars 31 are arranged in a matrix configuration along the X direction and the Y direction in the stacked body ML, the multiple memory transistors 35 are arranged three dimensionally along the X direction, the Y direction, and the Z direction.

A selection transistor 36 is formed at the intersection between the silicon pillar 34 and the selection gate electrode SG and includes the silicon pillar 34 as a channel, the selection gate electrode SG as a gate electrode, and the gate insulating film 28 as a gate insulating film. The selection transistor 36 also is a vertical transistor similar to the memory transistor 35 described above.

Because the ONO film 24 is disposed between the connection member 32 and the back gate BG, a back gate transistor 37 is formed and includes the connection member 32 as a channel, the back gate BG as a gate electrode, and the ONO film 24 as a gate insulating film. That is, the back gate BG functions as an electrode to control the conducting state of the connection member 32 by an electric field.

As a result, as illustrated in FIG. 3, a memory string 38 is formed along each of the U-shaped pillars 30 and is connected between the bit line BL and the source line SL. The selection transistor 36 is provided on both end portions of the memory string 38; the back gate transistor 37 is provided at the central portion of the memory string 38; and the same number of memory transistors 35 as electrode film 14 layers are connected in series between the back gate transistor 37 and each of the selection transistors 36. In other words, the multiple memory transistors 35 arranged three dimensionally in the stacked body ML are collected as the memory string 38 for each of the U-shaped silicon members 33.

The memory cell formation region of the device 1 illustrated in FIG. 4 and FIG. 5 is divided into multiple blocks 50. The positional relationship of the blocks 50 and each of the electrically conductive members will now be described.

As illustrated in FIG. 4 and FIG. 5, the multiple blocks 50 set in the memory cell formation region are arranged along the Y direction. The electrically conductive members of the device 1 aligned in the X direction, i.e., the control gate electrodes CG and the selection gate electrodes SG, and the U-shaped pillars 30 aligned in the Z direction are organized for each block 50. The back gate BG formed along the XY plane is subdivided and electrically mutually separated for each block 50. On the other hand, the bit lines BL aligned in the Y direction are aligned to pass through all of the blocks 50 and are shared by all of the blocks 50. An element separation film 59 is formed in the region of the silicon substrate 11 between the blocks 50.

The control gate electrodes CG of each of the blocks 50 are further organized into two groups. Namely, the control gate electrodes CG are divided into the control gate electrodes CG disposed in regions directly below the source lines SL and pierced by the silicon pillars having upper end portions connected to the source lines SL (labeled as "control gate electrodes CGs" in FIG. 4 and FIG. 5) and the control gate electrodes CG disposed in the regions other than the regions directly below the source lines SL and pierced by the silicon pillars having upper end portions connected to the bit lines BL (labeled as "control gate electrodes CGb" in FIG. 4 and FIG. 5). The control gate electrodes CGs are alternately arranged with the control gate electrodes CGb along the Y direction; the control gate electrodes CGs have common connections to each other; and the control gate electrodes CGb have common connections to each other. The control gate electrodes CGs and the control gate electrodes CGb are electrically separated.

Specifically, as illustrated in FIG. 4 and FIG. 5, the electrode films 14 (referring to FIG. 1) are not divided along the Y direction at both of the X-direction end portions of the stacked body ML; and incisions aligned in the Y direction are made intermittently. Thereby, in each of the blocks 50, the electrode films 14 are subdivided into a pair of mutually meshed comb-shaped patterns to form the control gate electrodes CGs and the control gate electrodes CGb, respectively. Although the control gate electrode CGs has three comb teeth and the control gate electrode CGb has two comb teeth in FIG. 5 to simplify the drawing, this embodiment is not limited thereto, and the number of comb teeth may be higher.

The lower end portions of the silicon pillars 31 disposed at the Y-direction end portions of each of the blocks 50 are not connected to the connection members 32. Therefore, such silicon pillars 31 do not form memory strings 38 but form dummy silicon pillars 31d (hereinbelow also referred to as "dummy pillars") and do not contribute to storing data. In the region directly below the dummy pillars 31d, the back gate BG is not provided, and the element separation film 59 is formed in the silicon substrate 11.

Operations of the nonvolatile semiconductor memory device 1 according to this embodiment having the configuration described above will now be described.

FIG. 6 illustrates the potentials applied to each of the electrodes and interconnects during the operations of the nonvolatile semiconductor memory device 1 according to this embodiment.

In the description hereinbelow, the memory transistor 35 is taken to be an n-channel field effect transistor. The state of the memory transistor 35 in which electrons are stored in the charge storage layer 26 and the threshold shifts to positive is taken as the value "0;" and the state in which electrons are not stored in the charge storage layer 26 and the threshold has not shifted is taken as the value "1." The number of control gate electrode layers is taken to be four; the memory transistors 35 used for writing and reading data (hereinbelow referred to as "selected cells") are taken to be the memory transistors of the third layer from the bottom having a silicon pillar connected to the bit line BL at the upper end portion of the silicon pillar. In other words, the control gate electrode CGb of the third layer from the bottom is the gate electrode of the selected cells.

(Writing Operation)

The writing of the data is performed in order simultaneously for multiple selected cells arranged in the X direction for one block at a time. Such multiple selected cells share the same control gate electrode CG while belonging to mutually different memory strings 38 as illustrated in FIG. 1. Further, the multiple memory strings 38 of such selected cells pierce a common selection gate electrode SG and are connected to a common source line SL while being connected to mutually different bit lines BL.

First, the Y coordinate of the memory strings 38 (hereinbelow referred to as "selected strings") of the memory transistors 35 to be written (the selected cells) is selected. Specifically, as illustrated in FIG. 6, a selection gate potential $V_{sg}$ is applied to the selection gate electrode SGb of the selected strings; and an OFF potential $V_{off}$ is applied to the selection gate electrode SGs. The OFF potential $V_{off}$ is applied to the selection gate electrodes SGb and SGs of the unselected memory strings 38. The OFF potential $V_{off}$ is a potential of the gate electrode of the transistor such that the transistor is switched to the OFF state, e.g., a reference potential Vss. The reference potential Vss is, for example, a grounding potential (0 V). The selection gate potential $V_{sg}$ is a potential of the selection gate electrode SG of the selection transistor 36 such that the conducting state of the selection transistor 36 is determined by the potential of the silicon pillar (the body potential), e.g., a potential higher than the reference potential Vss. The potential of the back gate BG is taken as an ON potential $V_{on}$. The ON potential $V_{on}$ is a potential of the gate electrode of the transistor such that the transistor is switched to the ON state, e.g., a power supply potential Vdd (e.g., 3.0 V).

Thereby, the selection transistors 36 on the bit line side of the selected strings are switched to the ON state and the OFF state by the potential of the bit lines BL, and the selection transistors 36 on the source line side are switched to the OFF state. All of the selection transistors 36 of the unselected memory strings 38 are switched to the OFF state. The back gate transistors 37 of all of the memory strings 38 are switched to the ON state.

Then, the reference potential Vss (e.g., 0 V) is applied to the bit lines connected to the selected cells to be written with the value "0;" and the power supply potential Vdd (e.g., 3.0 V) is applied to the bit lines BL connected to the selected cells to be written with the value "1." On the other hand, the power supply potential Vdd is applied to all of the source lines SL.

In this state, the positions of the selected cells of the selected strings are selected. Specifically, the potential of the control gate electrodes CG of the selected cells, e.g., the control gate electrodes CGb of the third layer from the bottom, is increased to a writing potential $V_{pgm}$ (e.g., 18 V); and the potential of the other control gate electrodes CG, i.e., the control gate electrodes CGb of the layers other than the third layer from the bottom and all of the control gate electrodes CGs are provided with an intermediate potential $V_{pass}$ (e.g., 10 V). At this time, because the control gate electrodes CGb of the third layer are connected to each other, the writing potential $V_{pgm}$ is applied to the control gate electrodes CGb of the third layer also for the unselected memory strings. The writing potential $V_{pgm}$ is a potential high enough to inject electrons from the silicon pillar 31 into the charge storage layer 26 of the ONO film 24, and is a potential higher than the reference potential Vss and the selection gate potential $V_{sg}$. That is, $Vss<V_{sg}<V_{pgm}$. Although the intermediate potential $V_{pass}$ is a potential higher than the reference potential Vss, the intermediate potential $V_{pass}$ is a potential lower than the writing potential $V_{pgm}$. That is, $Vss<V_{pass}<V_{pgm}$.

Thereby, for the selected cells to be written with the value "0," the potential difference between the source potential and the gate potential of the selection transistors 36 on the bit line side exceeds the threshold and the selection transistors 36 are switched to the ON state because the potential of the bit lines BL is the reference potential Vss (e.g., 0 V) and the potential of the selection gate electrodes SGb on the bit line side is the selection gate potential $V_{sg}$ higher than the reference potential Vss. As a result, the body potential $V_{body}$ of the selected cells approaches the reference potential Vss. The potential of the control gate electrodes CG of the selected cells is the writing potential $V_{pgm}$ (e.g., 18 V). Accordingly, the difference ($V_{pgm}-V_{body}$) between the gate potential and the body potential of the selected cells is sufficiently large, high-temperature electrons are created by the potential difference, and the electrons are injected from the silicon pillar into the charge storage layer 26 via the tunneling layer 27. Thereby, the value "0" is written into the selected cells.

On the other hand, for the selected cells to be written with the value "1," the potential of the bit lines BL is the positive potential Vdd (e.g., 3.0 V) and the potential of the selection gate electrodes SGb on the bit line side is the selection gate potential $V_{sg}$ higher than the reference potential Vss. Therefore, the potential difference between the source potential and the gate potential of the selection transistors 36 on the bit line side is small, and the selection transistors 36 are switched to the OFF state by a back gate effect. Thereby, the silicon pillars 31 are in a floating state and the body potential $V_{body}$ of the selected cells is maintained at a high value by coupling with the control gate electrodes CG provided with the intermediate potential $V_{pass}$ (e.g., 10 V). Therefore, the difference ($V_{pgm}-V_{body}$) between the writing potential $V_{pgm}$ (e.g., 18 V) of the control gate electrode CG of the selected cells and the body potential $V_{body}$ decreases, and electrons are not injected into the charge storage layer 26. As a result, the value "1" is written into the selected cells.

For the unselected memory strings 38, the potential of the silicon pillars 31 is in the floating state because the selection transistors 36 at both of the end portions are switched to the OFF state. In such a case, the body potential $V_{body}$ of the silicon pillars 31 can be controlled by the potential applied to the control gate electrodes CG, the voltage increase rate thereof, and the potential of the selection gate electrodes; and a high potential can be maintained. As a result, the difference ($V_{pgm}-V_{body}$) between the gate potential and the body potential of the memory transistors 35 decreases, electrons are not injected into the charge storage layer 26, and the initial value is maintained.

Thus, in this embodiment, the writing row (the Y coordinate) is selected by controlling the conducting state of the selection transistors, and data is written to the memory strings 38 arranged in the X direction in order by row. At this time, the potential of the control gate electrodes is controlled by block. Therefore, for the writing disturbance, it is sufficient to consider the total time necessary for writing the data to the memory strings in the block. Thereby, the disturbance time can be controlled by adjusting the block size.

(Reading Operation)

As illustrated in FIG. 6, the ON potential $V_{on}$ is applied to the back gate BG, and the back gate transistors 37 are switched to the ON state. The ON potential $V_{on}$ (e.g., 3.0 V) is applied to the selection gate electrodes SGs and SGb of the selected strings, and the selection transistors 36 are switched to the ON state. On the other hand, the OFF potential $V_{off}$ (e.g., 0 V) is applied to the selection gate electrodes SGs and SGb of the unselected memory strings 38, and the selection transistors 36 are switched to the OFF state.

A potential is applied to the control gate electrode CG of the selected cells, i.e., the control gate electrodes CGb of the third layer from the bottom, such that the value of the selected cells differs from the conducting state. The potential is, for example, the reference potential Vss (e.g., 0 V) and is a potential such that a current does not flow in the body in the case where the value of the selected cell is "0," i.e., when electrons are stored in the charge storage layer 26 and the threshold is shifted to positive and a current flows in the body in the case where the value of the selected cell is "1," i.e., when electrons are not stored in the charge storage layer 26 and the threshold is not shifted. For the memory transistors 35 other than those of the selected cells, a reading potential $V_{read}$ (e.g., 4.5 V) is applied to the control gate electrodes thereof such that the memory transistors 35 are switched to the ON state regardless of the value thereof.

In this state, a potential Vb1 (e.g., 0.7 V) is applied to each of the bit lines BL, and the reference potential Vss (e.g., 0 V) is applied to each of the source lines SL. As a result, a current flows in the selected string if the value of the selected cell is "1" and a current does not flow in the selected string if the value of the selected cell is "0." Accordingly, the value of the selected cell can be read by detecting the current flowing in the source line SL from the bit line BL via the selected string or by detecting the potential drop of the bit line BL. For the unselected memory strings 38, a current does not flow regardless of the values stored in the memory transistors 35 because the selection transistors 36 are in the OFF state.

(Erasing Operation)

The unit of erasing data is by block.

As illustrated in FIG. 6, the ON potential $V_{on}$ is applied to the back gate BG, and the back gate transistors 37 are switched to the ON state. The reference potential Vss (e.g., 0 V) is applied to all of the control gate electrodes CG of the block to be erased (hereinbelow referred to as "selected block"). The potential of the bit lines BL and the source lines SL is increased to an erasing potential $V_{erase}$ (e.g., 15 V). Also, the selection gate potential $V_{sg}$ lower than the erasing potential $V_{erase}$ is applied to the selection gate electrodes SGb and SGs. That is, $V_{sg} < V_{erase}$.

Thereby, the potential of the bit lines BL and the source lines SL is the erasing potential $V_{erase}$ (e.g., 15 V), and the potential of the selection gate electrodes SGb and SGs is the selection gate potential $V_{sg}$. Therefore, a Hall effect current is produced by tunneling between bands due to the potential difference between the bit lines BL and the selection gate electrodes SGb and the potential difference between the source lines SL and the selection gate electrodes SGs; and the potential of the silicon pillars 31, i.e., the body potential, increases. On the other hand, the reference potential Vss (e.g., 0 V) is applied to the control gate electrodes CG of the block to be erased (the selected block). Therefore, holes are injected into the charge storage layers 26 of the memory transistors 35 due to the potential difference between the silicon pillars 31 and the control gate electrodes CG, and electrons in the charge storage layer 26 undergo pair annihilation. As a result, the data is erased. Because the body potential increases due to the injection of the Hall effect current, it is necessary to provide a potential difference between the erasing potential $V_{erase}$ and the selection gate potential $V_{sg}$ sufficient to inject sufficient holes into the charge storage layer 26.

On the other hand, for the blocks not to be erased (the unselected blocks), the potential of the selection gate electrodes SGb and SGs is increased to a potential approaching the potential of the bit lines BL and the source lines SL, and the electric field between a diffusion layer connected to the bit lines BL or the source lines SL and the selection gate electrodes SGb or SGs is weakened such that a Hall effect current is not produced. Or, the potential of the control gate electrodes CG is increased simultaneously with that of the silicon pillars 31 such that holes in the silicon pillars 31 are not injected into the charge storage layers 26. Thereby, the values already written to the memory transistors 35 of the unselected blocks are maintained as-is.

A method for manufacturing the nonvolatile semiconductor memory device 1 according to this embodiment will now be described.

FIG. 7 to FIG. 15 are cross-sectional views of steps, illustrating the method for manufacturing the nonvolatile semiconductor memory device according to this embodiment.

FIG. 7 to FIG. 15 illustrate the same cross section as FIG. 2.

Figure 7:
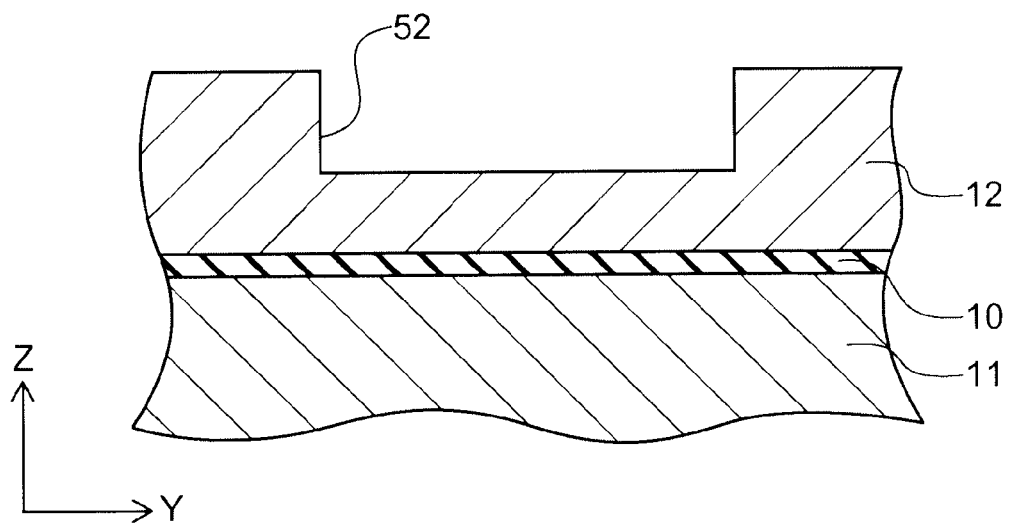
FIGS. 7 to 15 are cross-sectional views of steps, illustrating a method for manufacturing the nonvolatile semiconductor memory device according to the first embodiment.

First, as illustrated in FIG. 7, the silicon substrate 11 is prepared. A memory cell formation region is set in the silicon substrate 11. A peripheral circuit region (not illustrated) is set around the memory cell formation region. An element separation film is formed in a prescribed region of the upper layer portion of the silicon substrate 11. At this time, the element separation film 59 (referring to FIG. 4) also is formed in a region where the dummy pillars 31d (referring to FIG. 4) are formed in a subsequent step. Then, a thick film gate insulating film for high breakdown voltage transistors and a thin film gate insulating film for low breakdown voltage transistors are made separately in the peripheral circuit region. At this time, the insulating film 10 is formed on the silicon substrate 11 also in the memory cell formation region.

Then, the polysilicon film 12 is deposited on the insulating film 10 as a conducting film with a thickness of, for example, 200 nm. Photolithography and RIE (Reactive Ion Etching) are performed on the upper layer portion of the polysilicon film 12 in the memory cell formation region to make multiple trenches 52 having rectangular configurations aligned in the Y direction on the upper face of the polysilicon film 12. The trenches 52 are arranged in a matrix configuration along the X direction and the Y direction. The trenches 52 are recesses made in the upper face of the polysilicon film 12.

Figure 8:
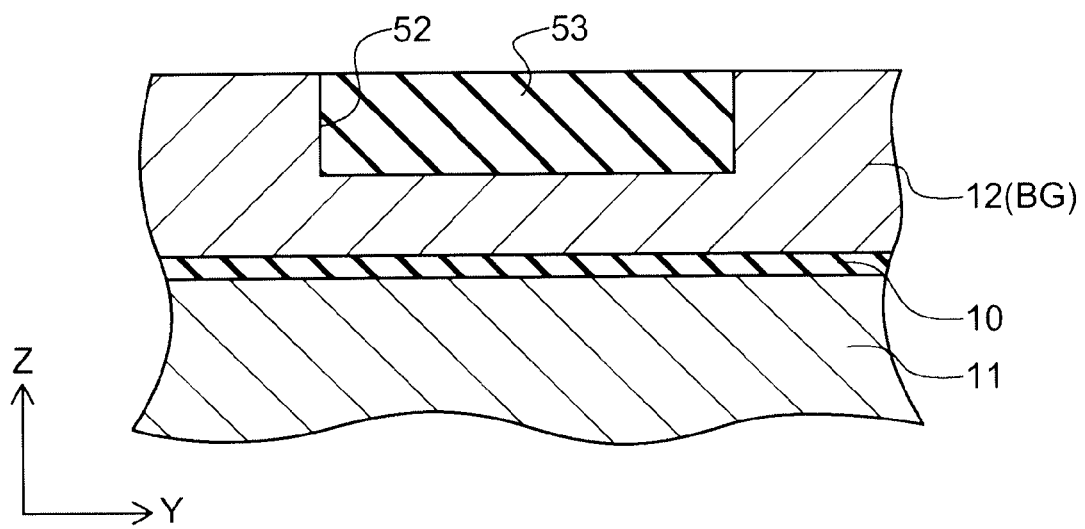

Continuing as illustrated in FIG. 8, a silicon nitride film is deposited by, for example, CVD (Chemical Vapor Deposition) to form a sacrificial member 53 on the polysilicon film 12. At this time, the sacrificial member 53 also is filled into the trenches 52. Then, the sacrificial member 53 and the polysilicon film 12 are patterned by, for example, photolithography and RIE. Thereby, the polysilicon film 12 in the memory cell formation region is divided for every block 50 (referring to FIG. 4); back gates BG made of the polysilicon film 12 are formed in flat-plate configurations in each of the blocks 50; and gate electrodes made of the polysilicon film 12 are formed in the peripheral circuit region. Also at this time, the polysilicon film 12 is removed from the region where the dummy pillars 31d will be formed at the end portions of each of the blocks 50.

Subsequently, a spacer made of silicon oxide is formed and a diffusion layer is formed by ion implantation in the peripheral circuit region. Then, an inter-layer insulating film is deposited in the peripheral circuit region, planarized, and recessed such that the upper face thereof is the same height as the upper face of the polysilicon film 12. Then, the sacrificial member 53 is recessed such that the sacrificial member 53 is removed from the polysilicon film 12 and left only in the interiors of the trenches 52.

Figure 9:
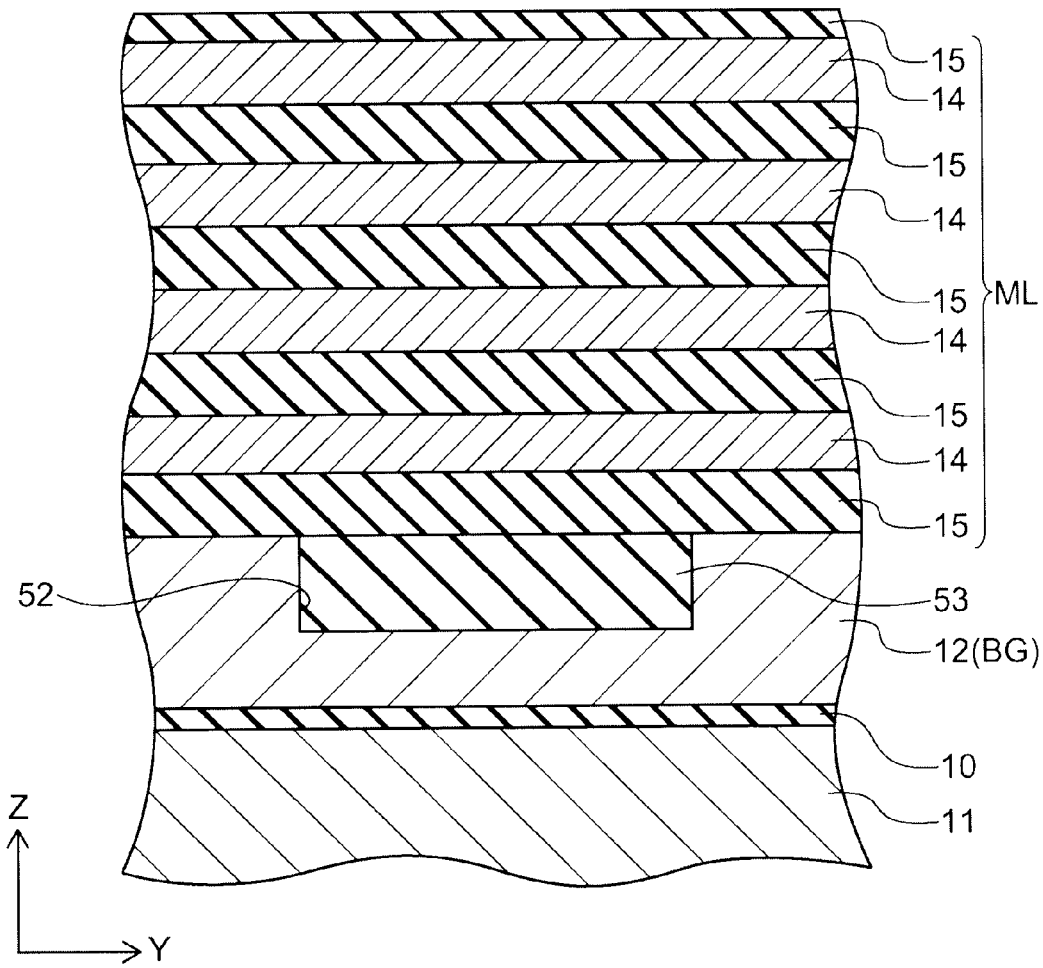

Continuing as illustrated in FIG. 9, the insulating films 15 made of, for example, silicon oxide are deposited alternately with the electrode films 14 made of, for example, polysilicon on the back gate BG (the polysilicon film 12) in the memory cell formation region to form the stacked body ML.

Figure 10:
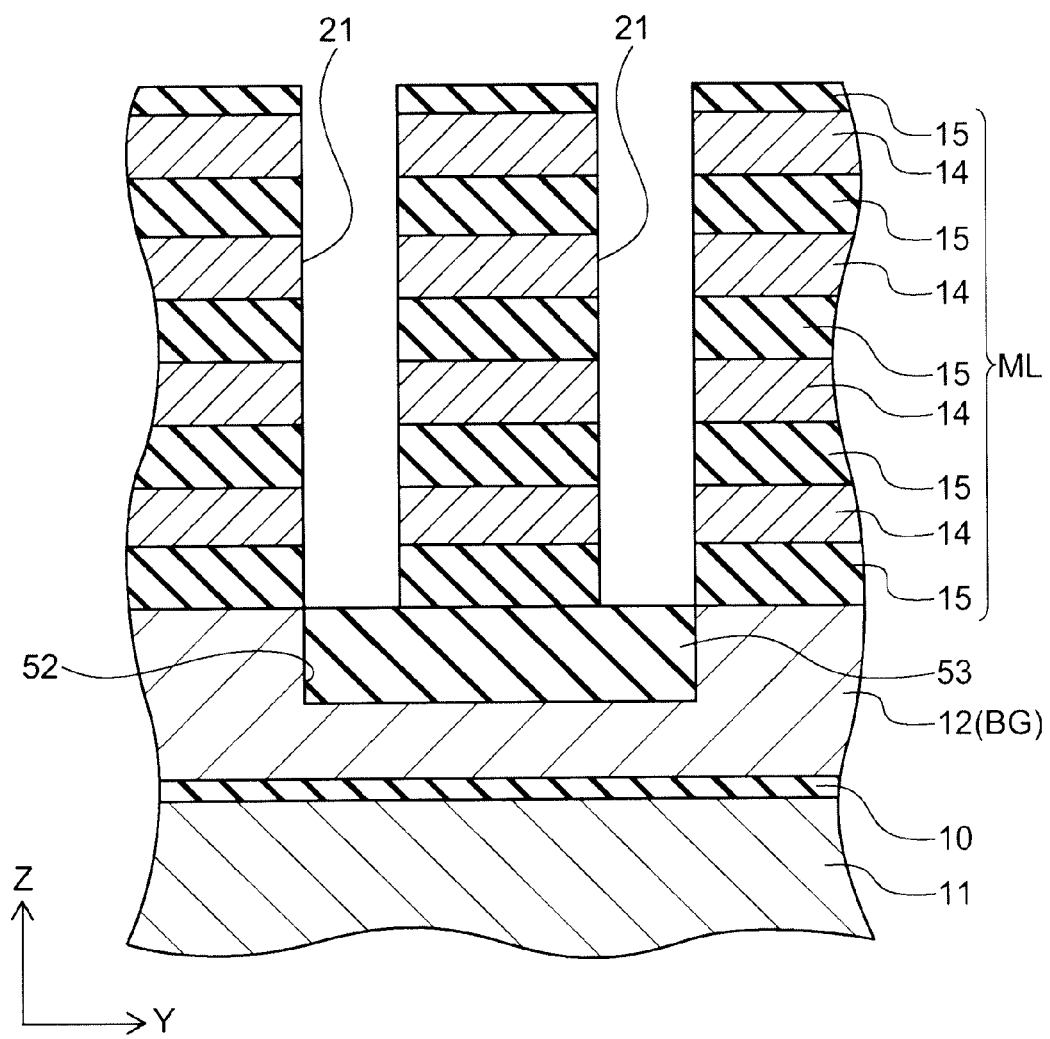

Then, as illustrated in FIG. 10, multiple through-holes 21 are collectively made in the stacked body ML by, for example, RIE to align in the Z direction. At this time, the through-holes 21 are arranged in a matrix configuration along the X direction and the Y direction. The bottom portions of the through-holes 21 reach both end portions of the sacrificial member 53 filled into the trenches 52. Thereby, two through-holes 21 adjacent to each other in the Y direction reach the sacrificial member 53.

Figure 11:
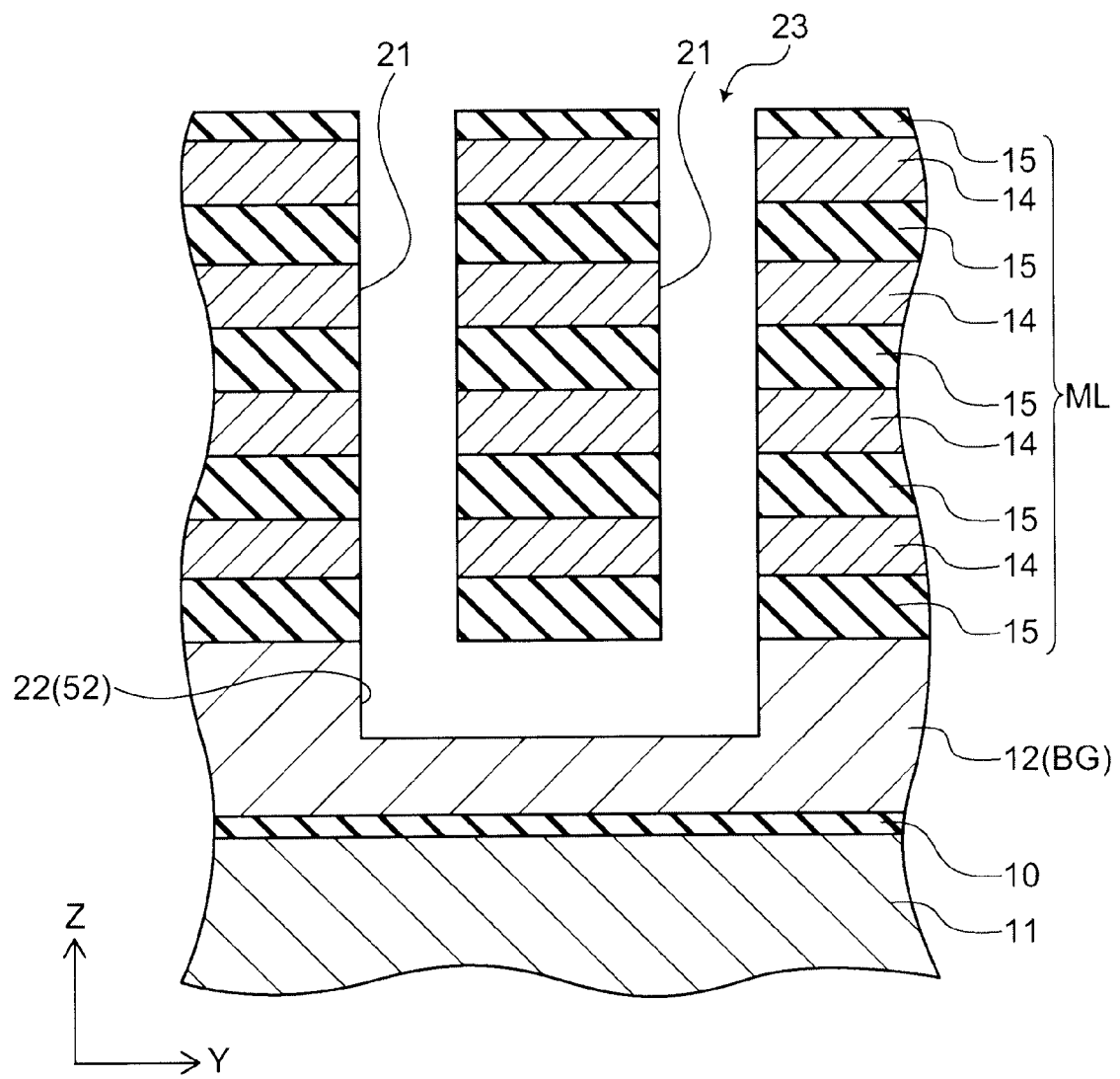

Continuing as illustrated in FIG. 11, wet etching is performed via the through-holes 21 to remove the sacrificial member 53 (referring to FIG. 10) from the trenches 52. Thereby, the trench 52 becomes the communicating hole 22, and one continuous U-shaped hole 23 is formed of the communicating hole 22 and the two through-holes 21 communicating with both end portions thereof.

Figure 12:
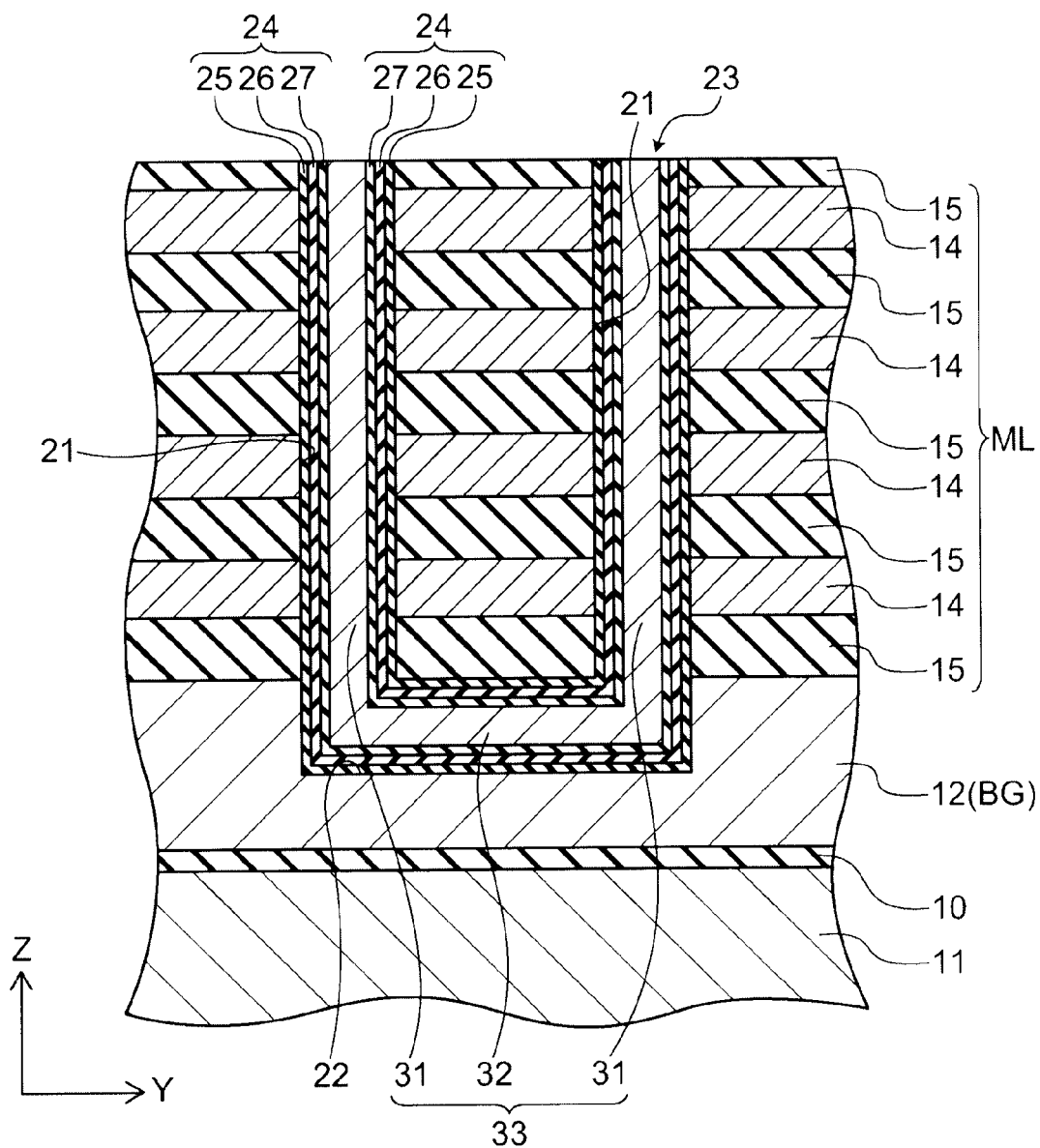

Then, as illustrated in FIG. 12, a silicon oxide film, a silicon nitride film, and a silicon oxide film are continuously deposited. Thereby, the block layer 25 made of the silicon oxide film, the charge storage layer 26 made of the silicon nitride film, and the tunneling layer 27 made of the silicon oxide film are stacked in this order on the inner face of the U-shaped hole 23 to form the ONO film 24.

Then, amorphous silicon is deposited on the entire surface. Thereby, amorphous silicon is filled into the U-shaped hole 23 to form the U-shaped silicon member 33. The U-shaped silicon member 33 is formed from the pair of silicon pillars 31 filled into the through-holes 21 and the one connection member 32 filled into the communicating hole 22. Subsequently, the amorphous silicon, the silicon oxide film, the silicon nitride film, and the silicon oxide film deposited on the stacked body ML are removed.

Figure 13:
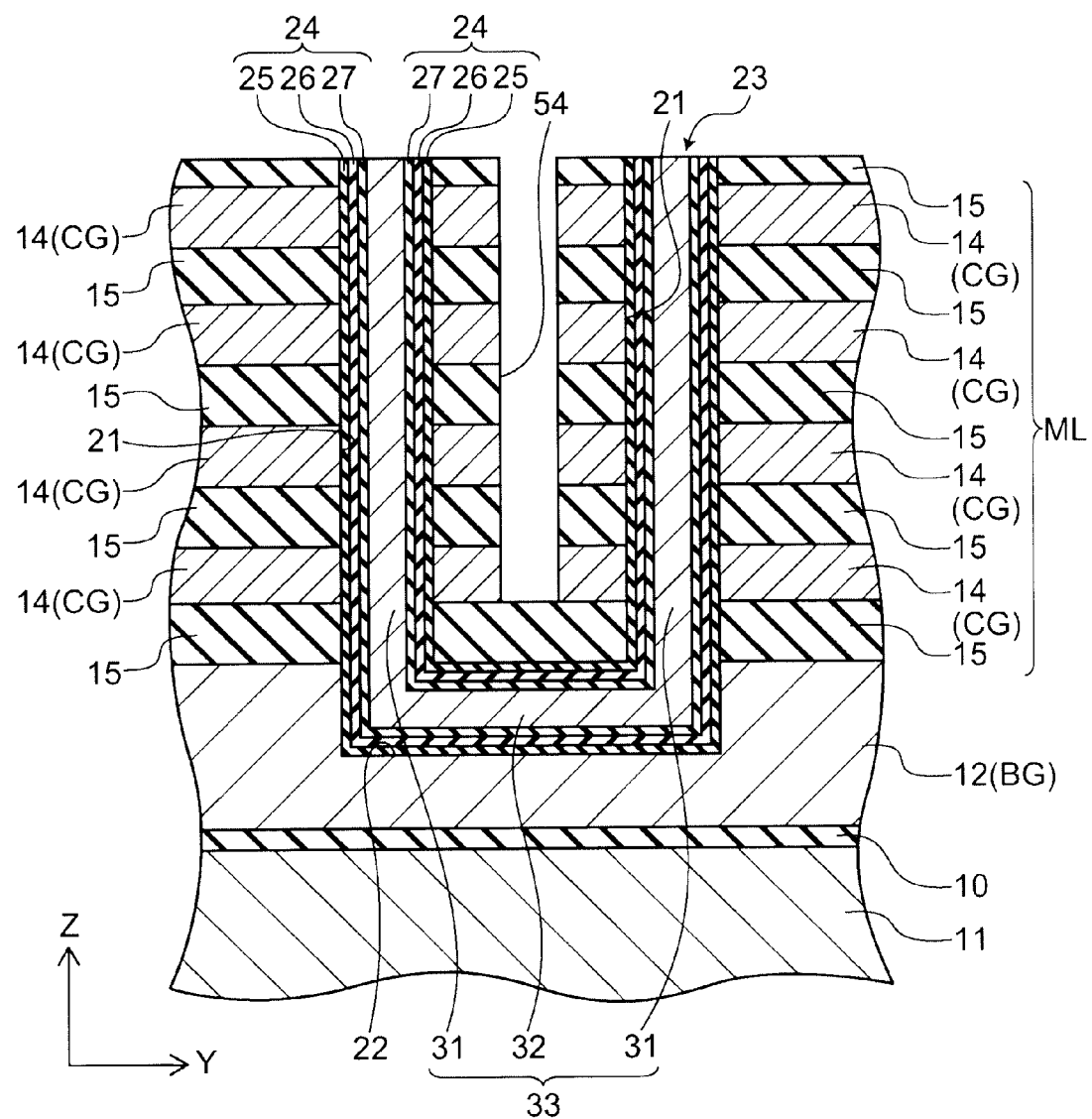

Continuing as illustrated in FIG. 13, the stacked body ML is patterned by, for example, RIE to make trenches 54 in the stacked body ML. The trench 54 is made to align in the X direction to link the regions between the two silicon pillars 31 connected to the connection member 32 and reach the insulating film 15 of the lowermost layer.

At this time, as illustrated in FIG. 4 and FIG. 5, the trenches 54 are made to divide the electrode films 14 into a pair of mutually meshed comb-shaped patterns. In other words, the trenches 54 are made in the central portion of the stacked body ML in the X direction to align in the X direction. Thereby, the electrode films 14 are divided into multiple control gate electrodes CG aligned in the X direction. At this time, the trenches 54 are not made in the regions directly above the regions between the connection members 32 in the Y direction. Thereby, each of the control gate electrodes CG is pierced by two of the silicon pillars 31 arranged along the Y direction. At both X-direction end portions of the stacked body ML, the trenches 54 are not aligned in the X direction and are made to align intermittently in the Y direction. Thereby, the control gate electrodes CGb and CGs alternately disposed along the Y direction at the central portion of the stacked body ML in the X direction have common connections to each other at each of the X-direction end portions of the stacked body ML.

Figure 14:
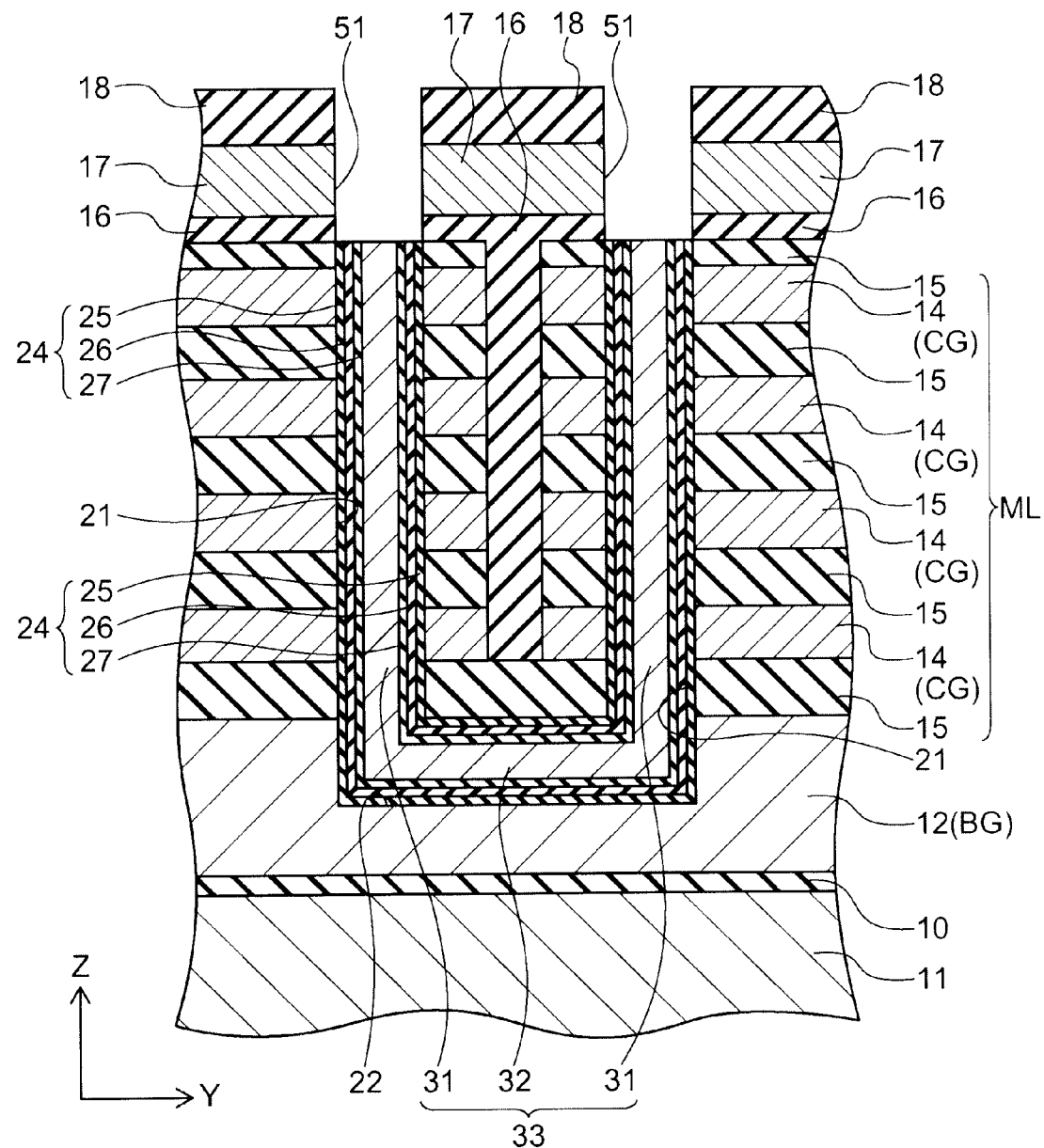

Then, as illustrated in FIG. 14, the insulating film 16 is deposited on the stacked body ML and planarized. The insulating film 16 also is filled into the trenches 54. Then, the conducting film 17 made of, for example, amorphous silicon is deposited, etched, and left only in the memory cell region.

Then, a resist film (not illustrated) is formed, for example, on the conducting film 17, and the stacked body ML is patterned into a stairstep configuration by repeatedly performing etching using the resist film as a mask and performing slimming of the resist film. Thereby, both X-direction end portions of the control gate electrodes CG for each level are not covered with the control gate electrodes CG of the level thereabove as viewed from above (the Z direction); and in subsequent steps, contacts can be formed from above to each level of the control gate electrodes CG. Then, an etching stopper film (not illustrated) made of, for example, silicon nitride is formed to cover the stacked body ML patterned into the stairstep configuration; an inter-layer insulating film (not illustrated) is formed thereupon; and the upper face is planarized. Thereby, the inter-layer insulating film is filled around the stacked body ML.

Subsequently, the insulating film 18 is formed on the conducting film 17. The through-holes 51 are made to pierce the insulating film 18, the conducting film 17, and the insulating film 16 to reach the upper ends of the through-holes 21 in the stacked body ML.

Figure 15:
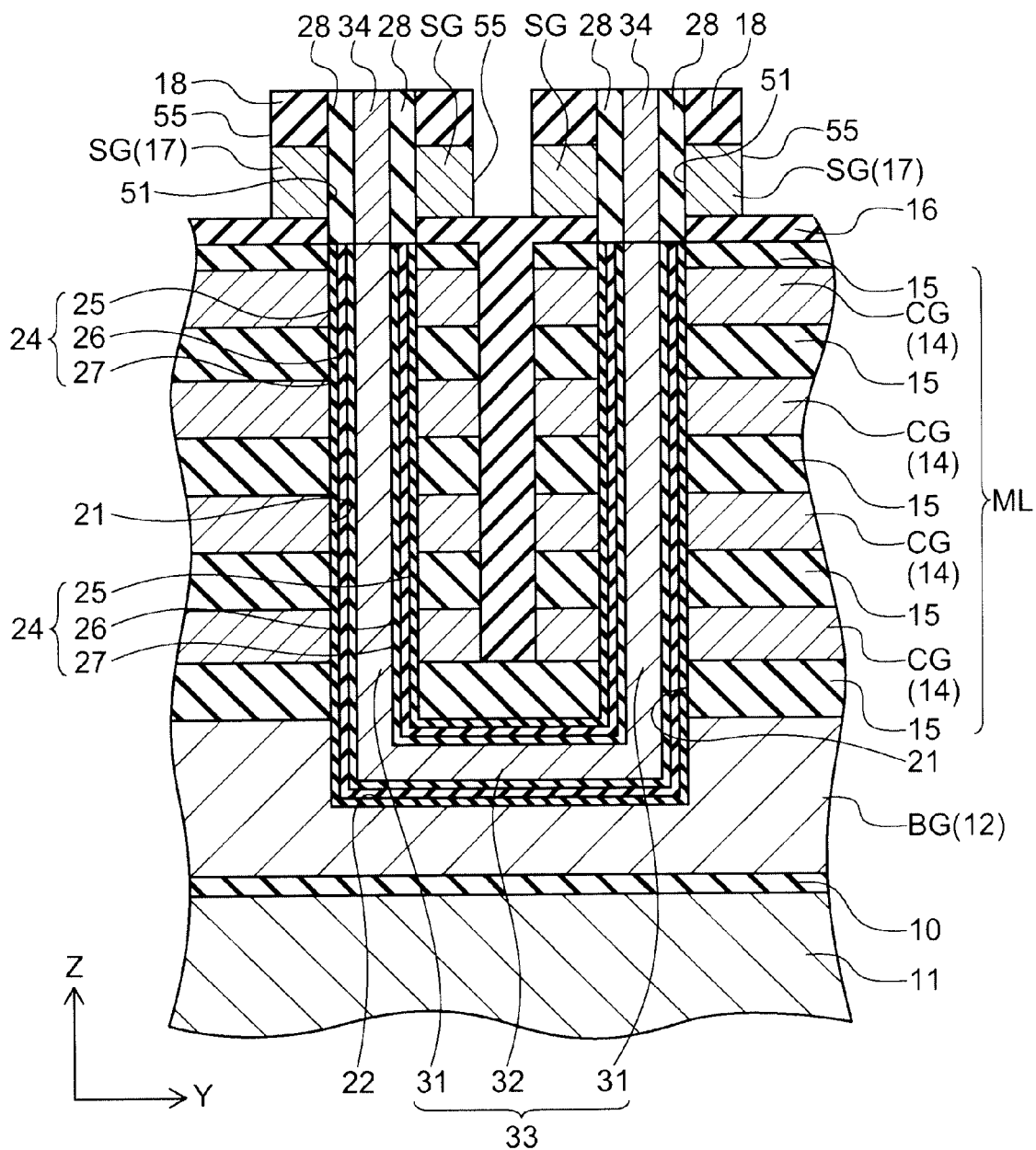

Then, as illustrated in FIG. 15, an insulating film is deposited on the entire surface, and amorphous silicon is deposited. Etch-back is performed on the amorphous silicon and the insulating film to leave the amorphous silicon and the insulating film only in the through-holes 51. Thereby, the gate insulating film 28 is formed on the inner face of the through-holes 51 and the amorphous silicon is filled. Then, heat treatment is performed at a temperature of, for example, 600° C. to crystallize the amorphous silicon in the through-holes 51 to form polysilicon. Ion implantation is performed on the polysilicon using arsenic (As) with, for example, an acceleration voltage of 40 keV and a dose of $3 \times 10^{15}$ cm$^{-2}$ to form a drain diffusion layer (not illustrated). Thereby, the silicon pillars 34 are formed in the through-holes 51. The silicon pillars 34 connect to the silicon pillars 31.

Continuing, patterning by RIE and the like is performed on the insulating film 18 and the conducting film 17 to make trenches 55 aligned in the X direction in the regions between the silicon pillars 34 adjacent to each other in the Y direction. Thereby, the conducting film 17 is divided along the Y direction to form multiple selection gate electrodes SG aligned in the X direction.

Then, as illustrated in FIG. 2, the insulating film 19 is formed on the insulating film 18, source plugs SP are buried in the insulating film 19, and the source lines SL are formed on the insulating film 19 to align in the X direction. At this time, the source lines SL are connected to the drain diffusion layers of some of the silicon pillars 34 via the source plugs SP. Contacts (not illustrated) are formed in the inter-layer insulating film (not illustrated) provided around the stacked body ML to connect to each of the control gate electrodes CG and each of the selection gate electrodes SG from above. Then, the insulating film 20 is formed on the insulating film 19 to cover the source lines SL. Then, the bit plugs BP are buried in the insulating films 20 and 19 and the bit lines BL are formed on the insulating film 20 to align in the Y direction. At this time, the bit lines BL are connected to the drain diffusion layers of the remaining silicon pillars 34 via the bit plugs BP. Thereby, the nonvolatile semiconductor memory device 1 is manufactured.

Effects of this embodiment will now be described.

In this embodiment, the U-shaped silicon member 33 is formed integrally without breaks by filling polysilicon into the interior of the U-shaped hole 23. Therefore, unlike the stacked memory device discussed in, for example, JP-A 2007-266143(Kokai), contacts are unnecessary between the silicon of the lower portions of the through-holes 21. Accordingly, it is unnecessary to perform pre-processing such as hydrofluoric acid processing to remove native oxide films and the like from the surface of silicon members formed beforehand, and the charge storage layer is not damaged by such pre-processing. As a result, a nonvolatile semiconductor memory device can be realized having good memory transistor characteristics.

Also, according to this embodiment, unlike the stacked memory device discussed in Patent Literature 1, the source lines can be formed as metal interconnects disposed above the stacked body ML instead of diffusion layers formed in the silicon substrate. Thereby, the resistance of the source lines can be reduced, and data can be easily read. The impurity concentration of the silicon pillars does not undesirably increase as in the case where the source lines are formed of diffusion layers, impurities of the diffusion layers desorb into a vapor, and the impurities re-adhere during the depositing of the silicon pillars. Therefore, the cut-off characteristics of the transistor do not decline as in the case where the impurity concentration of the silicon pillars increases. Moreover, by disposing the source lines on the stacked body ML, the vias for connecting to the source lines can be made shallow, and the vias can be easily constructed. Thereby, fine vias can be made, and therefore one source line can be formed for each of two series of silicon pillars arranged along the X direction.

Further, according to this embodiment, the selection gate electrodes SGs on the source line side also can be disposed above the stacked body ML by forming the memory strings in U-shaped configurations and disposing the source lines above the stacked body ML. Thereby, the vias for connecting the upper layer interconnects to the selection gate electrodes SGs can be short, and a low aspect ratio can be maintained for finer vias. As a result, the selection gate electrodes SGs on the source line side can be divided every silicon pillar and driven independently from each other similarly to the selection gate electrodes SGb on the bit line side. Thereby, the degrees of freedom of the operations of the device 1 increase. For example, only the silicon pillars of the selected strings during a reading operation may be connected to the source lines SL instead of those of all of the memory strings; and thereby, the disturbance time during the reading can be reduced.

Also, according to this embodiment, each of the control gate electrodes CG are pierced by two silicon pillars 31 adjacent to each other in the Y direction; and two silicon pillars 31 connected to each other by the connection member 32 pierce mutually different control gate electrodes CG. Thereby, it is possible to store data in the memory transistors 35 of each of the memory strings 38 mutually independently, while the width of the control gate electrodes CG in the Y direction can be larger than the arrangement period of the silicon pillars 31. As a result, when making the trenches 54 in the stacked body ML during the step illustrated in FIG. 13, it is sufficient to make one trench 54 for every two silicon pillars 31. Thereby, the width of each portion of the stacked body ML divided by the trenches 54 can be increased. As a result, it is possible to prevent the collapse of such portions during the step illustrated in FIG. 13.

Such effects will now be described more specifically with reference to a comparative example.

Figures 16A, 16B:
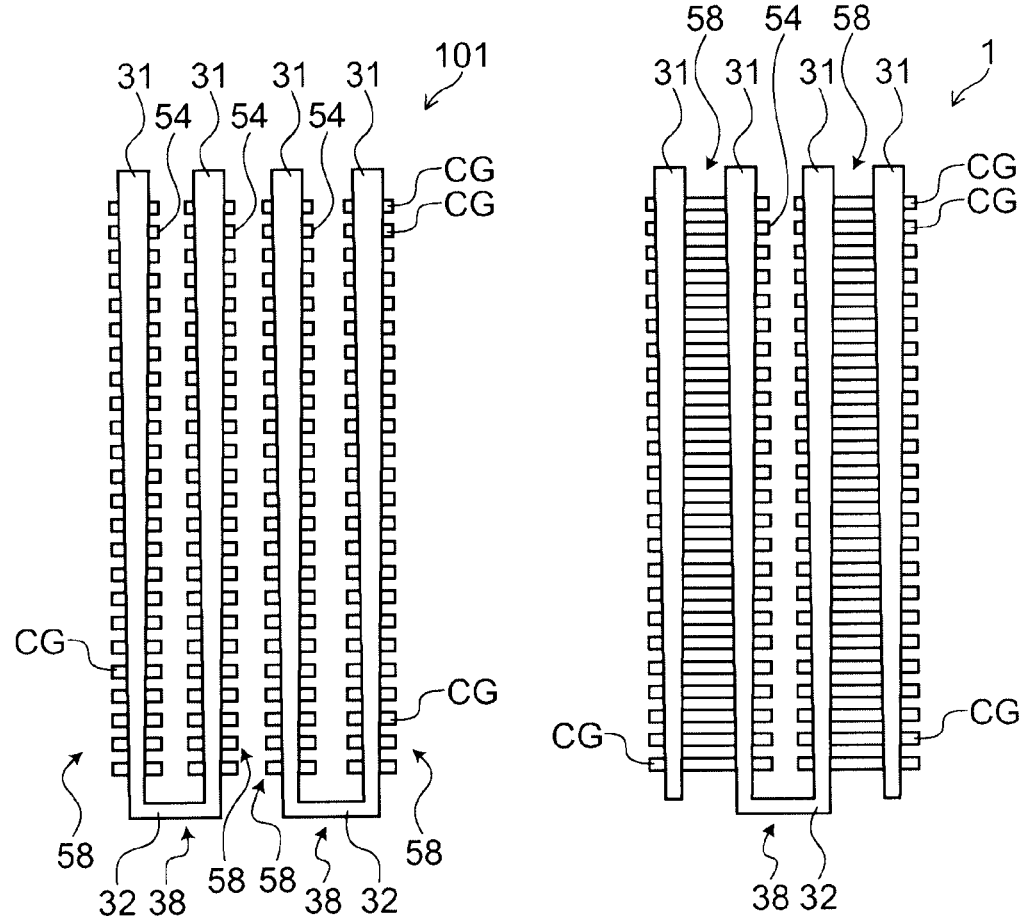
FIGS. 16A and 16B are cross-sectional views of steps, illustrating portions of a stacked body divided in the step illustrated in FIG. 13.

FIGS. 16A and 16B are cross-sectional views of steps, illustrating portions of a stacked body divided in the step illustrated in FIG. 13. FIG. 16A illustrates the comparative example. FIG. 16B illustrates this embodiment.

In a device 101 according to the comparative example of this embodiment illustrated in FIG. 16A, the trenches 54 are made in all of the regions between the silicon pillars 31 arranged along the Y direction. In such a case, although all of the memory transistors of each of the memory strings 38 can be controlled independently because the control gate electrodes are formed for every series made of the silicon pillars 31 arranged in the X direction, in each portion 58 of the stacked body ML divided by the trenches 54, the width in the Y direction is undesirably exceedingly narrow. Therefore, there is a possibility that the portions 58 may collapse partway through the step or the control gate electrodes CG formed in adjacent portions 58 may undesirably contact each other.

Conversely, according to the device 1 according to this embodiment illustrated in FIG. 16B, the trenches 54 are made in every other region between the silicon pillars 31 arranged along the Y direction. Thereby, the trenches 54 are not made in the remaining every other region, and therefore the width of the portions 58 divided by the trenches 54 can be widened. In one example, in the case where twenty-four stacks of the control gate electrodes CG are used, the aspect ratio of the portion 58 in the YZ plane is 5.6 for this embodiment, which is less than half of 13.7 for the comparate example. Thereby, the possibility that the portions 58 may collapse can be drastically reduced. Also, by making the trenches 54 between the two silicon pillars 31 connected to each other by the connection member 32, these silicon pillars 31 can pierce mutually different control gate electrodes CG. Thereby, all of the memory transistors of each of the memory strings 38 can be provided with mutually different control gate electrodes, and the memory transistors can be independently controlled.

As illustrated in FIG. 5, in this embodiment, the device 1 is divided into multiple blocks 50, and the control gate electrodes CG are electrically separated between the blocks. Thereby, independent potentials can be applied to the control gate electrodes for each of the blocks, and data can be written and erased by block. In this embodiment, the dummy silicon pillars (dummy pillars) 31d are provided at the Y-direction end portions of the blocks 50. Thereby, the through-holes 21 can be made while maintaining periodicity at the end portions of the blocks 50 as well, and the lithography for making the through-holes 21 is easier.

Although the chip surface area increases somewhat by providing the dummy pillars and by disposing the dummy pillars only at the end portions of the blocks as described above, a large increase of the surface area can be suppressed. In one example, in the case where twenty-four stacks of the control gate electrode CG are used, the increase of the surface area due to providing the dummy pillars can be suppressed to 7.69%.

Further, in each of the blocks, the multiple memory transistors arranged in the X direction share control gate electrodes, and the control gate electrodes have common connections to each other. Thereby, the control gate electrodes of each of the levels are collected into the two control gate electrodes CGs and CGb. Thereby, the driver circuit for driving the control gate electrodes can be shared. As a result, it is unnecessary to increase the number of drive circuits proportionally to the increase of the number of bits per unit surface area, and the increase of the surface area due to increasing driver circuits can be suppressed.

A second embodiment of the invention will now be described.

Figure 17:
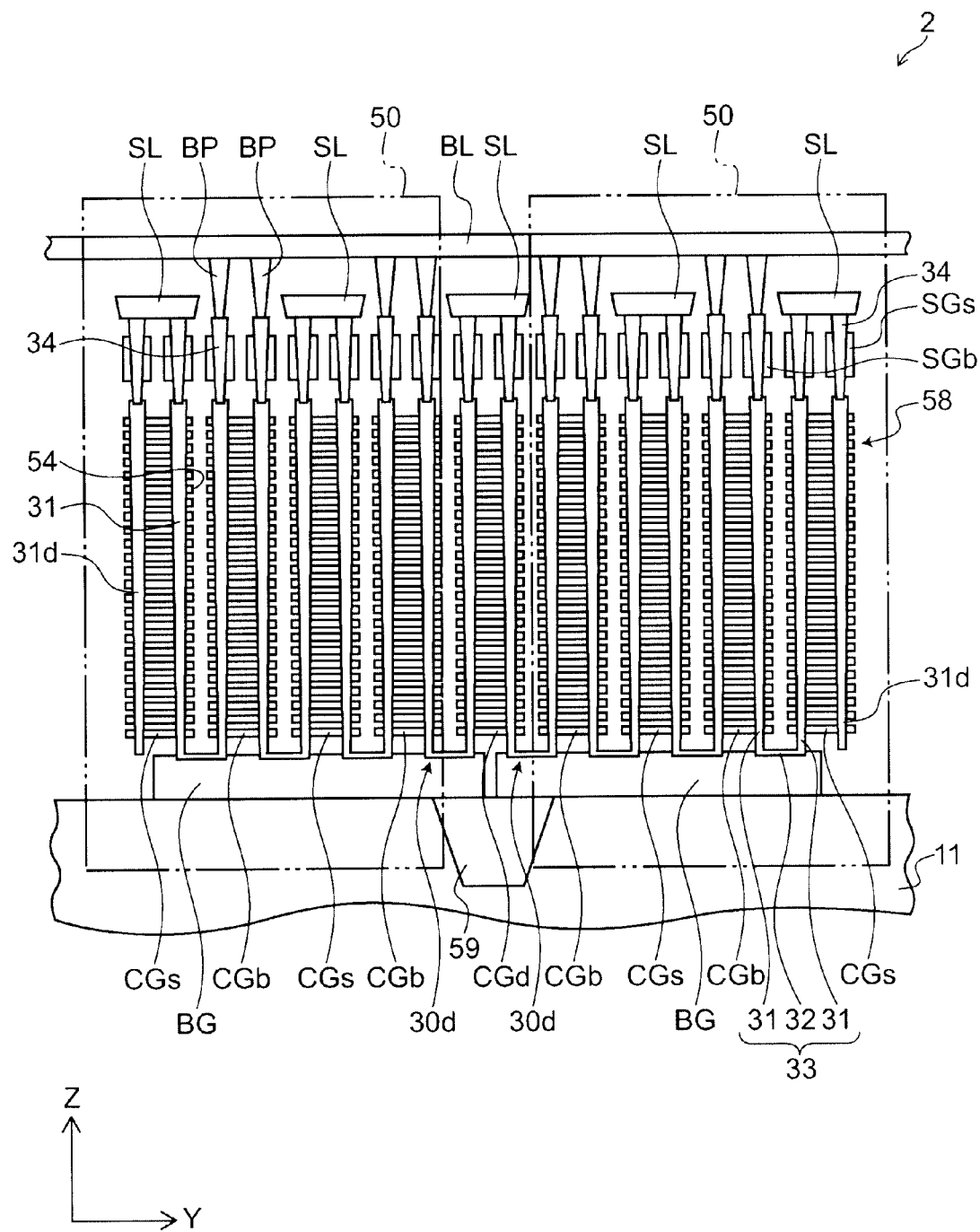
FIG. 17 is a cross-sectional view illustrating a nonvolatile semiconductor memory device according to a second embodiment of the invention.

FIG. 17 is a cross-sectional view illustrating a nonvolatile semiconductor memory device according to this embodiment.

Figure 18:
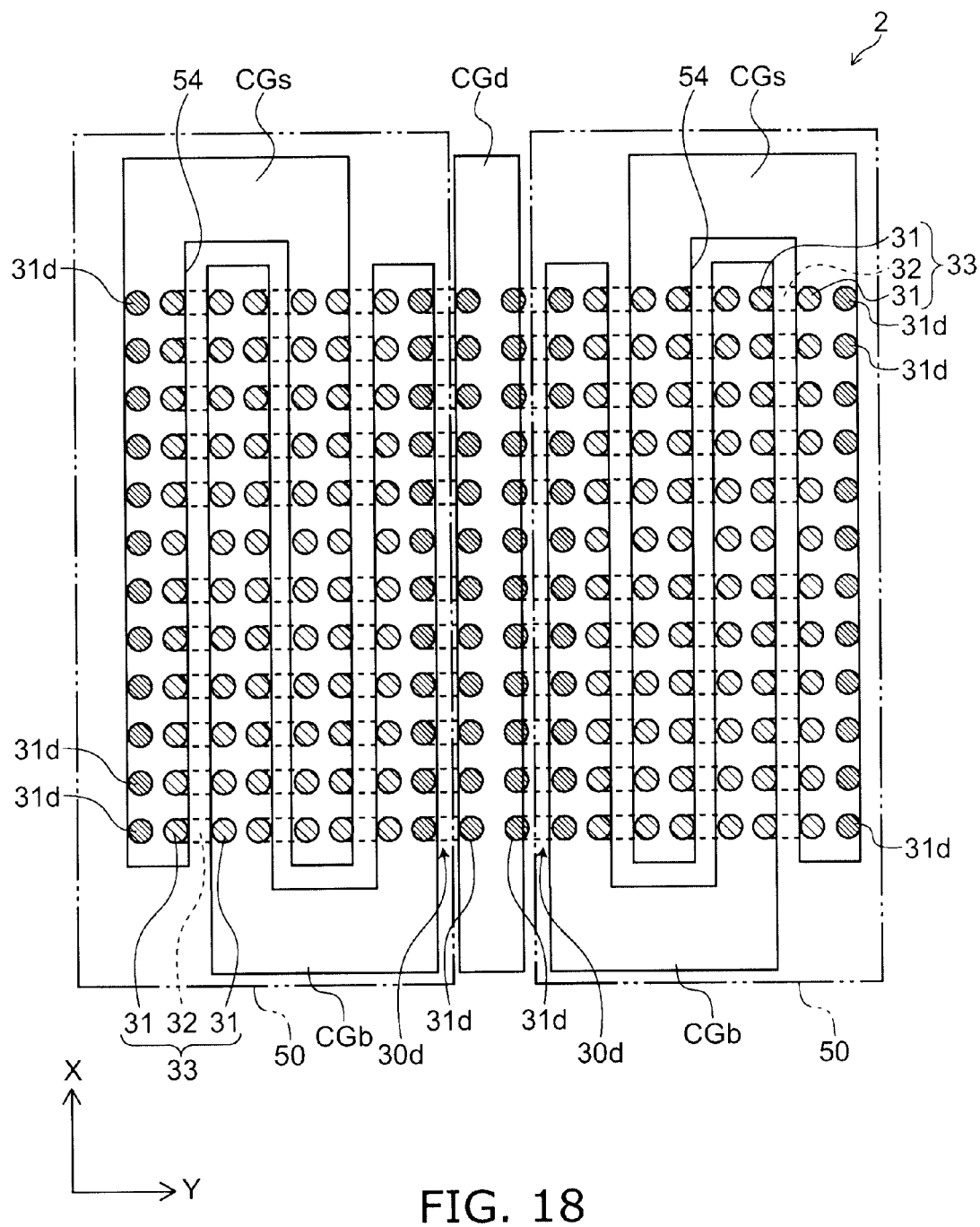
FIG. 18 is a plan view illustrating the nonvolatile semiconductor memory device according to the second embodiment.

FIG. 18 is a plan view illustrating the nonvolatile semiconductor memory device according to this embodiment.

For easier viewing of the drawings, only the silicon substrate and the electrically conducting portions are illustrated in FIG. 17 and FIG. 18, and the insulating portions are omitted. In particular, FIG. 18 illustrates only the silicon substrate, the back gates, the control gate electrodes, and the U-shaped silicon members.

As illustrated in FIG. 17 and FIG. 18, a nonvolatile semiconductor memory device 2 according to this embodiment includes dummy control gate electrodes CGd disposed between two adjacent blocks 50 and connected to none of the control gate electrodes CGs and the control gate electrodes CGb. The dummy control gate electrodes CGd (hereinbelow also referred to as "dummy gate electrodes") have line configurations aligned in the X direction and are in, for example, an electrically floating state.

The portions of the control gate electrodes CGs aligned in the X direction in each of the blocks 50 (the comb teeth portions), the portions of the control gate electrodes CGb aligned in the X direction in each of the blocks 50, and the dummy gate electrodes CGd disposed between the blocks 50 are arranged with uniform spacing along the Y direction such that the control gate electrode CGb, the dummy gate electrodes CGd, and the control gate electrode CGb are arranged in this order along the Y direction in and around the region between the blocks 50.

Similarly to the control gate electrodes CGs and CGb, the dummy gate electrodes CGd also are pierced by two series of silicon pillars 31 arranged along the X direction. The silicon pillars 31 piercing the dummy gate electrodes CGd are connected to the source line SL disposed in the region directly thereabove. Each of these silicon pillars 31 is connected by the connection member 32 to a silicon pillar 31 piercing the control gate electrodes CGb disposed adjacent to the dummy gate electrodes CGd to form one U-shaped pillar 30d. The U-shaped pillar 30d is a dummy U-shaped pillar that does not contribute to storing data.

The back gates BG are provided in the regions directly below the blocks 50 and the region between the blocks 50. In other words, although the back gates BG are provided in the regions directly below the normal U-shaped pillars 30 and the dummy U-shaped pillars 30d, the back gates BG are not provided in the regions directly below the dummy silicon pillars 31d. The element separation film 59 is formed in the region of the silicon substrate 11 between the blocks 50. Otherwise, the configuration, operations, and manufacturing method of this embodiment are similar to those of the first embodiment described above.

The effects of this embodiment will now be described.

According to this embodiment, the periodicity of the arrangement of the bit plugs BP for connecting the bit lines BL to the silicon pillars 34 can be kept constant also for the boundary portion between the blocks 50. In other words, an arrangement pattern in which two bit plugs BP are alternately arranged with two source plugs SP along the Y direction can be continuously realized both in the interior of the blocks 50 and in the regions between the blocks 50. Thereby, the lithography margin for forming the bit plugs BP can be easily ensured. Otherwise, the effects of this embodiment are similar to those of the first embodiment described above.

Although an example is illustrated in this embodiment where the dummy gate electrodes CGd are in a floating state, the dummy gate electrodes CGd may be driven independently from the control gate electrodes CGs and CGb. Thereby, it is possible to store data also in the U-shaped pillars 30d.

A modification of this embodiment will now be described.

Figure 19:
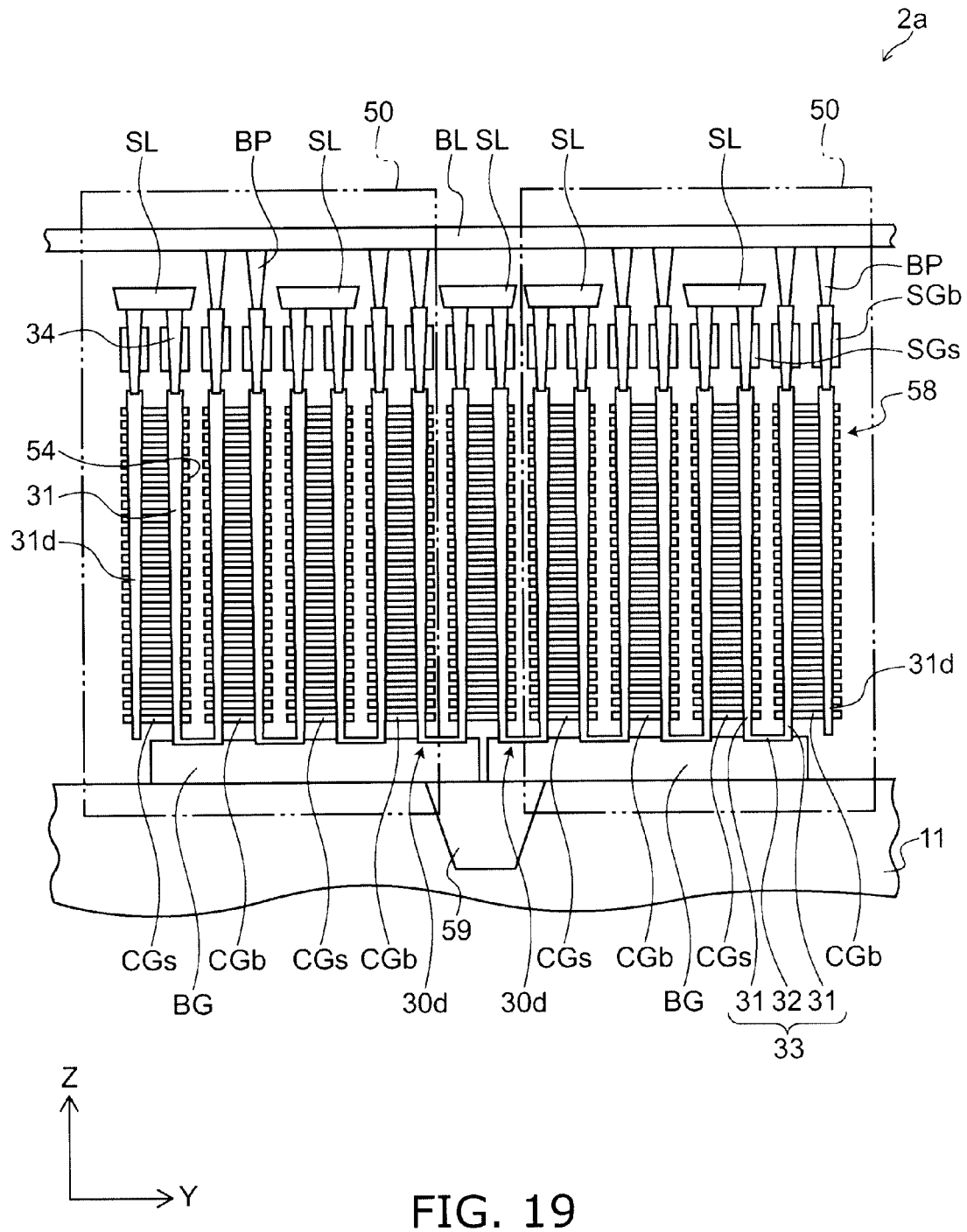
FIG. 19 is a cross-sectional view illustrating a nonvolatile semiconductor memory device according to a modification of the second embodiment.

FIG. 19 is a cross-sectional view illustrating a nonvolatile semiconductor memory device according to this modification.

Figure 20:
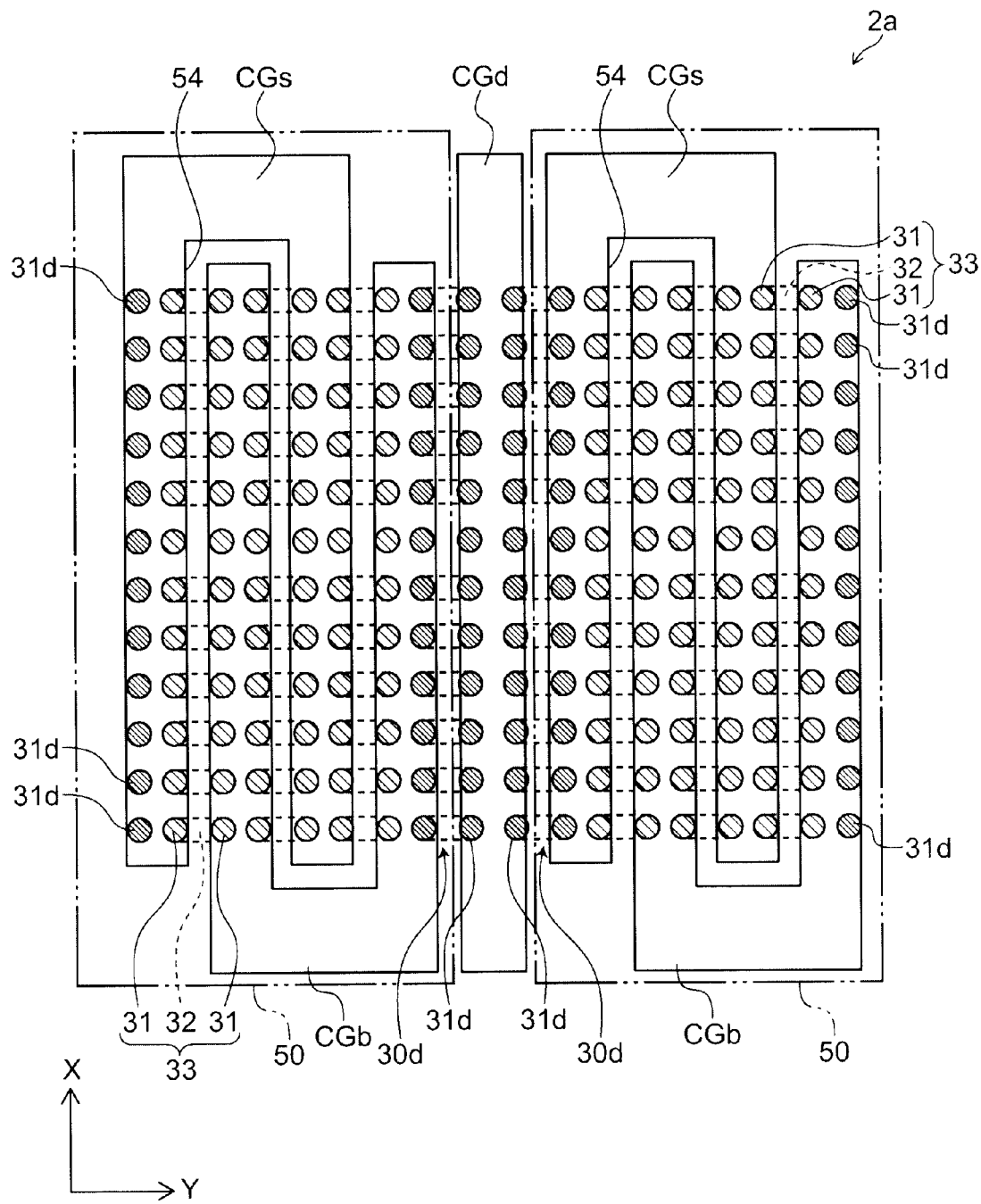
FIG. 20 is a plan view illustrating the nonvolatile semiconductor memory device according to the modification of the second embodiment.

FIG. 20 is a plan view illustrating the nonvolatile semiconductor memory device according to this modification.

For easier viewing of the drawings, only the silicon substrate and the electrically conducting portions are illustrated in FIG. 19 and FIG. 20, and the insulating portions are omitted. In particular, FIG. 20 illustrates only the silicon substrate, the back gates, the control gate electrodes, and the U-shaped silicon members.

As illustrated in FIG. 19 and FIG. 20, the disposition of the control gate electrodes in the blocks 50 in a nonvolatile semiconductor memory device 2a according to this modification differs from that of the nonvolatile semiconductor memory device 2 (referring to FIG. 17 and FIG. 18) according to the second embodiment described above. In other words, in this modification, the control gate electrodes CGb, the dummy gate electrodes CGd, and the control gate electrodes CGs are arranged in this order along the Y direction in and around the region between the blocks 50. Otherwise, the configuration, operations, manufacturing method, and effects of this modification are similar to those of the second embodiment described above.

A third embodiment of the invention will now be described.

Figure 21:
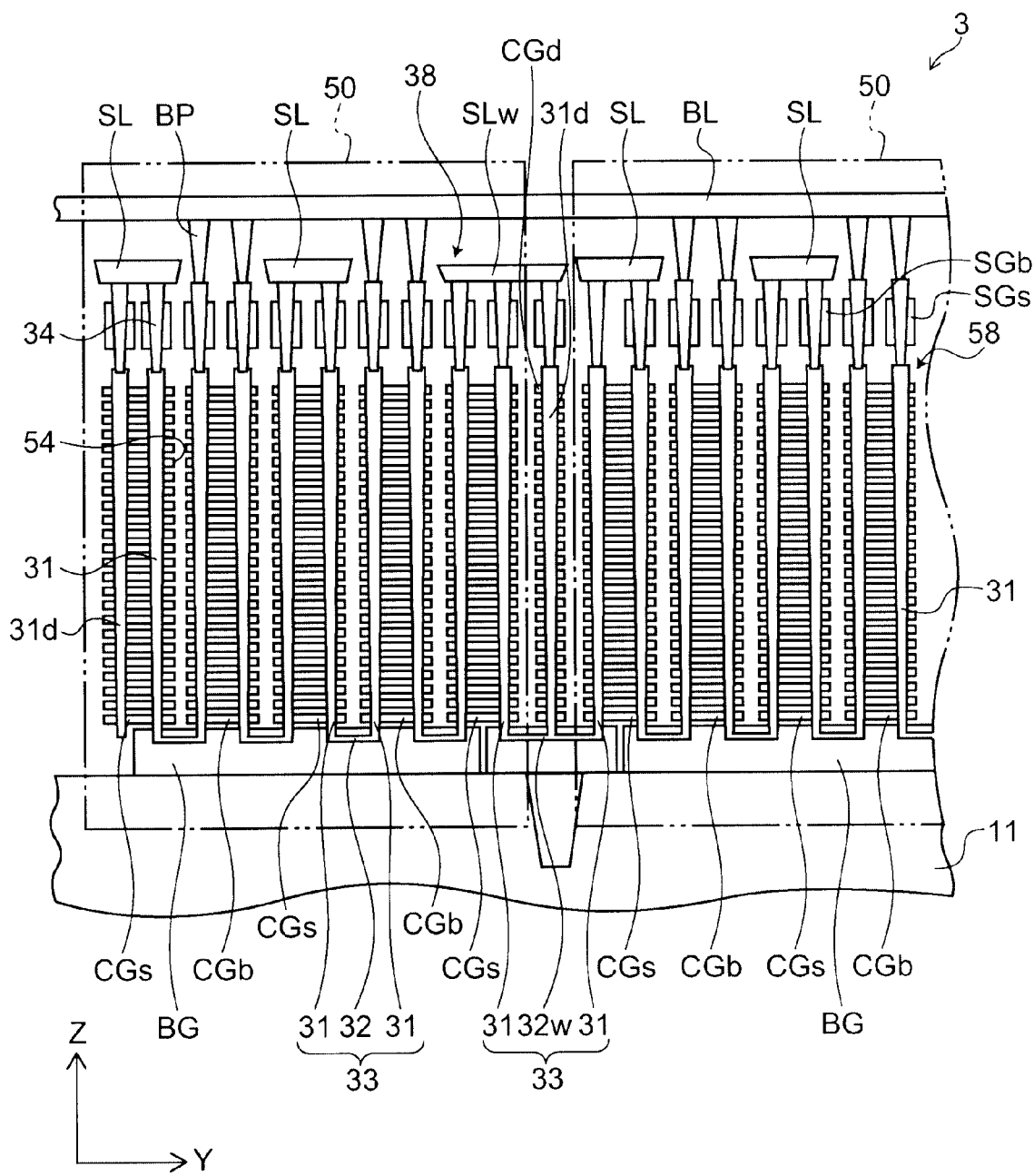
FIG. 21 is a cross-sectional view illustrating a nonvolatile semiconductor memory device according to a third embodiment of the invention.

FIG. 21 is a cross-sectional view illustrating a nonvolatile semiconductor memory device according to this embodiment.

Figure 22:
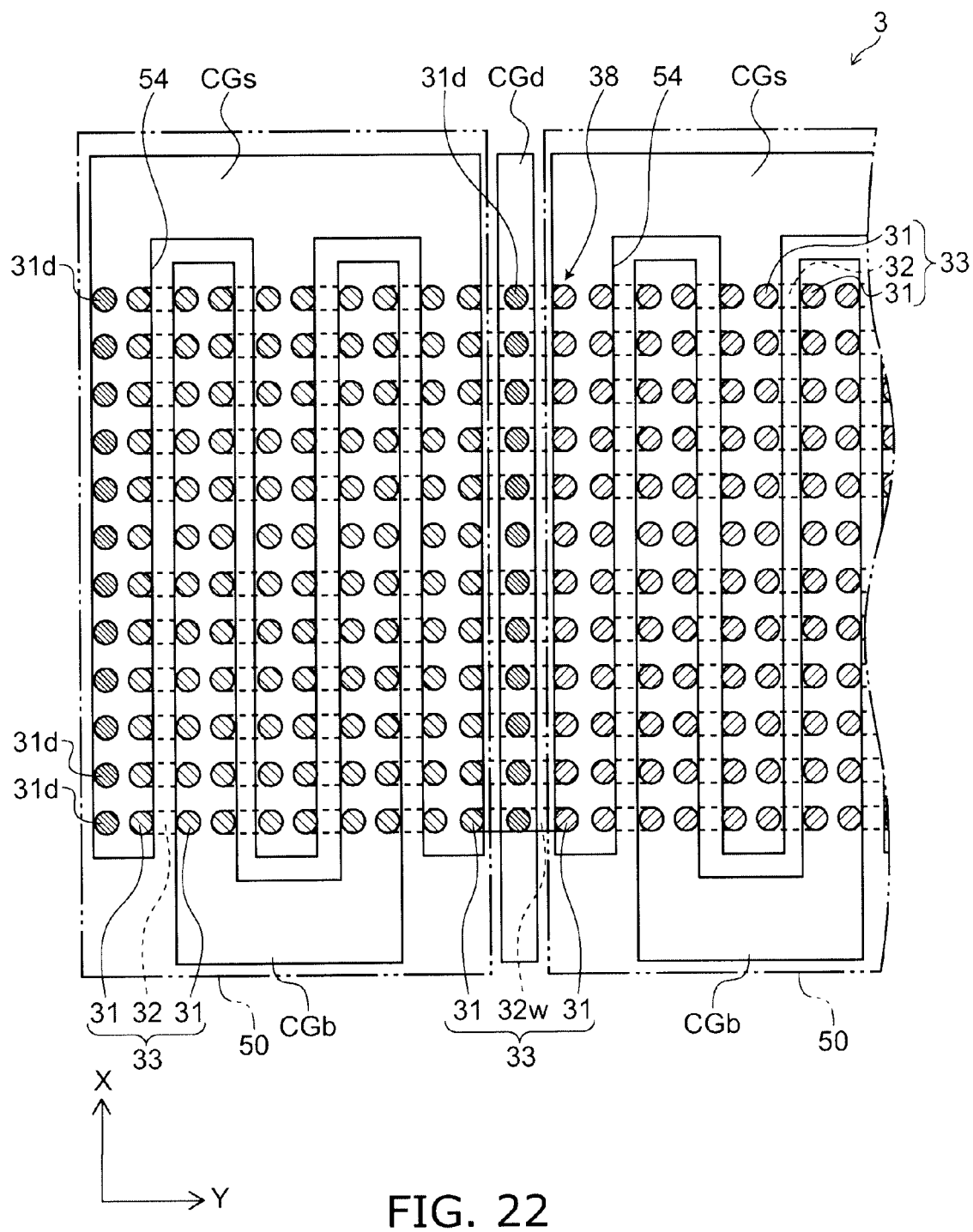
FIG. 22 is a plan view illustrating the nonvolatile semiconductor memory device according to the third embodiment.

FIG. 22 is a plan view illustrating the nonvolatile semiconductor memory device according to this embodiment.

For easier viewing of the drawings, only the silicon substrate and the electrically conducting portions are illustrated in FIG. 21 and FIG. 22, and the insulating portions are omitted. In particular, FIG. 22 illustrates only the silicon substrate, the back gates, the control gate electrodes, and the U-shaped silicon members.

As illustrated in FIG. 21 and FIG. 22, a nonvolatile semiconductor memory device 3 according to this embodiment differs from the nonvolatile semiconductor memory device 2a (referring to FIG. 19 and FIG. 20) according to the modification of the second embodiment described above in that the dummy gate electrodes CGd are narrow, and the silicon pillars 31 piercing the dummy gate electrodes CGd are arranged in one series along the X direction. The control gate electrodes CGs, the dummy gate electrodes CGd, and the control gate electrodes CGs are arranged in this order along the Y direction in and around the region between the blocks 50.

A source line SLw having a width wider than that of other source lines SL is provided in the region directly above the one silicon pillar 31 piercing the dummy gate electrode CGd and the two silicon pillars 31 piercing the one control gate electrode CGs disposed on one Y direction side of the dummy gate electrode CGd. The upper end portions of these three silicon pillars 31 have a common connection to the source line SLw. That is, three series of the silicon pillars 31 are connected to the source line SLw.

A connection member 32w having a Y direction length longer than that of the other connection members 32 is provided in the region directly below the one silicon pillar 31 piercing the dummy gate electrode CGd and the two silicon pillars 31 disposed one on each side of the one silicon pillar 31 in the Y direction. The lower end portions of these three silicon pillars 31 have a common connection to the connection member 32w. That is, three series of silicon pillars 31 are connected to the connection member 32w.

The dummy gate electrodes CGd are insulated from the control gate electrodes CGs and CGb and are in, for example, a floating state. Therefore, the silicon pillar 31d piercing the dummy gate electrodes CGd is connected between the source line SLw and the connection member 32w but does not contribute to storing data and is a dummy pillar. The two silicon pillars 31 disposed one on each of the Y direction sides of the silicon pillar 31 piercing the dummy gate electrodes CGd are connected to each other via the connection member 32w. Otherwise, the configuration, operations, and manufacturing method of this embodiment are similar to those of the modification of the second embodiment described above.

The effects of this embodiment will now be described.

Comparing to the second embodiment and the modification of the second embodiment described above, the chip surface area can be reduced according to this embodiment because the dummy pillars are disposed in one series in the region between the blocks 50. Although the portion of the divided stacked body ML including the dummy gate electrodes CGd has a narrower width and there is an increased possibility of collapse only for this portion, the widths of the other portions are the width of two series of silicon pillars, and the possibility of collapsing is low. Also, the number of the portions including the dummy gate electrodes CGd is lower than the number of the portions including the control gate electrodes CGs and the control gate electrodes CGb. Therefore, as an entirety, the possibility that discrepancies may occur in the device 3 due to the collapse of the divided portions does not increase very much. Otherwise, the effects of this embodiment are similar to those of the first embodiment described above.

Hereinabove, the invention is described with reference to exemplary embodiments. However, the invention is not limited to these embodiments. For example, additions, deletions, or design modifications of components or additions, omissions, or condition modifications of steps appropriately made by one skilled in the art in regard to the embodiments described above are within the scope of the invention to the extent that the purport of the invention is included. For example, although a description of the peripheral circuit is omitted in the embodiments described above, various circuits are provided in actual nonvolatile semiconductor memory devices to drive the memory strings and the like. Also, although a description of process films such as etching stopper films, diffusion prevention films, etc., are omitted in the embodiments described above, such process films may be appropriately formed according to the necessity of the process. Further, planarizing steps, cleaning steps, etc., may be appropriately provided between the steps described above.

The invention claimed is:

1. A nonvolatile semiconductor memory device, comprising:
   a stacked body including a plurality of insulating films alternately stacked with a plurality of electrode films, the electrode films being divided to form a plurality of control gate electrodes aligned in a first direction;
   a plurality of selection gate electrodes provided on the stacked body and aligned in the first direction;
   a plurality of semiconductor pillars aligned in a stacking direction of the stacked body, the semiconductor pillars being arranged in a matrix configuration along the first direction and a second direction intersecting the first direction to pierce the control gate electrodes and the selection gate electrodes;
   a plurality of source lines aligned in the first direction and connected to upper end portions of some of the semiconductor pillars;
   a plurality of bit lines aligned in the second direction and connected to upper end portions of a remainder of the semiconductor pillars;
   a connection member connecting a lower end portion of one of the semiconductor pillars to a lower end portion of one other of the semiconductor pillars, an upper end portion of the one of the semiconductor pillars being connected to the source line, an upper end portion of the one other of the semiconductor pillars being connected to the bit line;
   a charge storage layer provided between one of the control gate electrode and one of the semiconductor pillar; and
   a gate insulating film provided between one of the selection gate electrode and one of the semiconductor pillar,
   at least some of the control gate electrodes being pierced by two of the semiconductor pillars adjacent to each other in the second direction, two of the semiconductor pillars being connected to each other by the connection member and provided to pierce mutually different control gate electrodes.

2. The device according to claim 1, wherein
   the control gate electrodes are organized into a plurality of blocks set along the second direction,
   the control gate electrodes of each of the blocks are further organized into two groups,
   the control gate electrodes of one group are alternately arranged along the second direction with the control gate electrodes of another group in each of the blocks,
   the control gate electrodes of each of the groups have a common connection for the group, and
   a lower end portion of the semiconductor pillar disposed at an end portion in the second-direction of each of the blocks is not connected to the connection member.

3. The device according to claim 2, further comprising:
   a substrate; and
   a back gate provided between the substrate and the stacked body,
   the connection member being disposed in an interior of the back gate,
   the back gate not being provided in a region directly below a semiconductor pillar not connected to the connection member.

4. The device according to claim 2, wherein the electrode films of each of the blocks are subdivided into a pair of mutually meshed comb-shaped patterns.

5. The device according to claim 2, wherein a control gate electrode is disposed between the two adjacent blocks and connected to none of the control gate electrodes of the one group and the control gate electrodes of the another group of each of the two blocks.

6. The device according to claim 5, wherein a configuration of the control gate electrode connected to none is a line configuration aligned in the first direction.

7. The device according to claim 5, wherein the control gate electrode connected to none is in a floating state.

8. The device according to claim 5, wherein the control gate electrodes of the one group, the control gate electrode connected to none, and the control gate electrodes of the another group are arranged with uniform spacing along the second direction.

9. The device according to claim 5, wherein
   the control gate electrode connected to none is pierced by two of the semiconductor pillars, the two of the semiconductor pillars being adjacent in the second direction and connected to a common one of the source lines, and
   another two of the semiconductor pillars on each adjacent side in the second direction of the two of the semiconductor pillars piercing the control gate electrode connected to none are connected to one of the bit lines.

10. The device according to claim 5, wherein
    the control gate electrode connected to none is pierced by two of the semiconductor pillars, the two of the semiconductor pillars being adjacent in the second direction and connected to a common one of the source lines, and as viewed from the two of the semiconductor pillars, another two of the semiconductor pillars disposed on one side adjacent in the second direction are connected to one of the bit lines and still another two of the semiconductor pillars disposed on another side adjacent in the second direction are connected to one of the source lines.

11. The device according to claim 5, wherein the control gate electrode connected to none is pierced by one series of dummy semiconductor pillars arranged along the first direction, the dummy semiconductor pillars are connected to the connection member connected to two of the semiconductor pillars disposed on each side of the dummy semiconductor pillars, and the two of the semiconductor pillars are connected to the source lines.

12. The device according to claim 11, wherein the dummy semiconductor pillars are connected to one of the source lines connected to one of the two of the semiconductor pillars.

13. The device according to claim 12, wherein a width of the one of the source lines connected to the dummy semiconductor pillars is wider than a width of another one of the source lines.

14. The device according to claim 1, further comprising:

a substrate; and a back gate provided between the substrate and the stacked body, the connection member being disposed in an interior of the back gate.

* * * * *